(12) United States Patent
Inn

(10) Patent No.: US 6,304,108 B1
(45) Date of Patent: Oct. 16, 2001

(54) REFERENCE-CORRECTED RATIOMETRIC MOS CURRENT SENSING CIRCUIT

(75) Inventor: Bruce Lee Inn, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 09/616,831

(22) Filed: Jul. 14, 2000

(51) Int. Cl.$^7$ ........................................................ H03K 5/22
(52) U.S. Cl. ............................................. 327/72; 327/543
(58) Field of Search .................................. 323/266, 269, 323/272, 316; 327/50, 66, 67, 72, 538, 540, 541, 543

(56) References Cited

U.S. PATENT DOCUMENTS

| | | | |
|---|---|---|---|
| 4,820,968 | 4/1989 | Wrathall | 323/316 |
| 5,646,520 | 7/1997 | Frank et al. | 324/158.1 |
| 5,668,468 | * 9/1997 | Cargill | 323/316 |
| 5,767,545 | * 6/1998 | Takahashi | 257/341 |
| 5,917,319 | 6/1999 | Frank et al. | 324/158.1 |
| 6,081,140 | * 6/2000 | King | 327/77 |

OTHER PUBLICATIONS

"Dual–Channel Power Distribution Switch", MIC2026/2076 Data Sheet, Micrel, Mar. 2000.

\* cited by examiner

*Primary Examiner*—Jung Ho Kim
(74) *Attorney, Agent, or Firm*—Skjerven Morrill MacPherson LLP; Carmen C. Cook

(57) ABSTRACT

A reference-corrected ratiometric current sensing circuit for sensing a current flowing through a load and a power-controlling pass device includes a sense device, a sense resistor, and a variable reference current source for providing a varying reference current. The varying reference current is varied according to a ratio of the voltage across the sense device to the voltage across the pass device. The ratiometric current sensing circuit of the present invention is capable of accurate current sensing in spite of disparities that may occur between the voltages across the sense and the pass devices. In one embodiment, the variable reference source includes a transconductance amplifier circuit that provides an output current indicative of the voltage difference at its input terminals. Furthermore, the variable reference current source includes a translinear circuit that works with the transconductance amplifier circuit to implement the prescribed arithmetic operations to generate the varying reference current. The ratiometric current sensing circuit of the present invention provides accurate current sensing for load conditions ranging from normal overload to a shorted load.

34 Claims, 18 Drawing Sheets

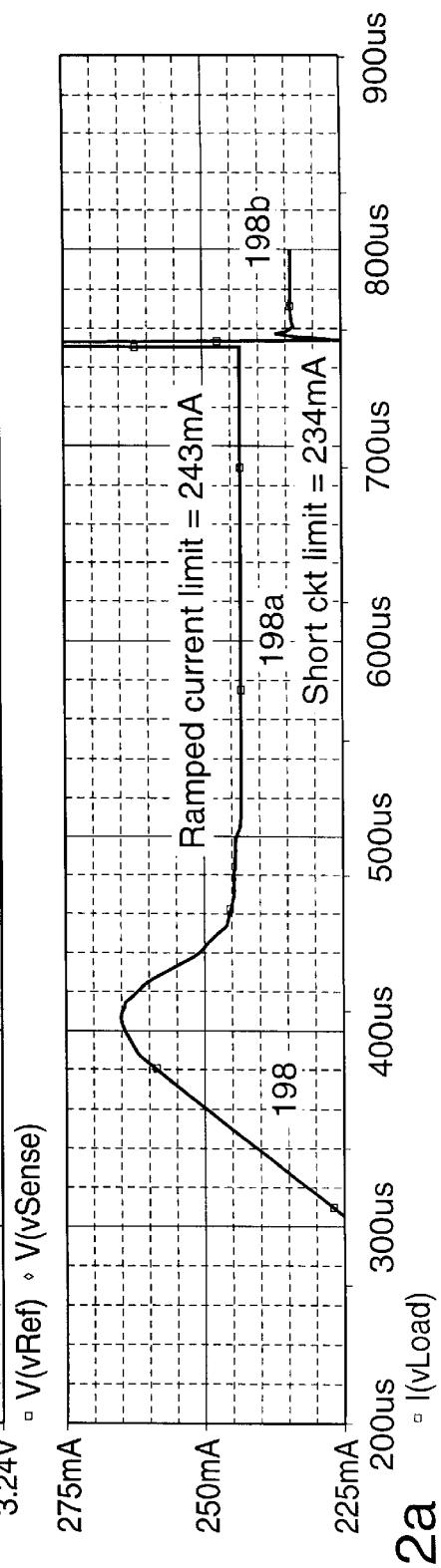
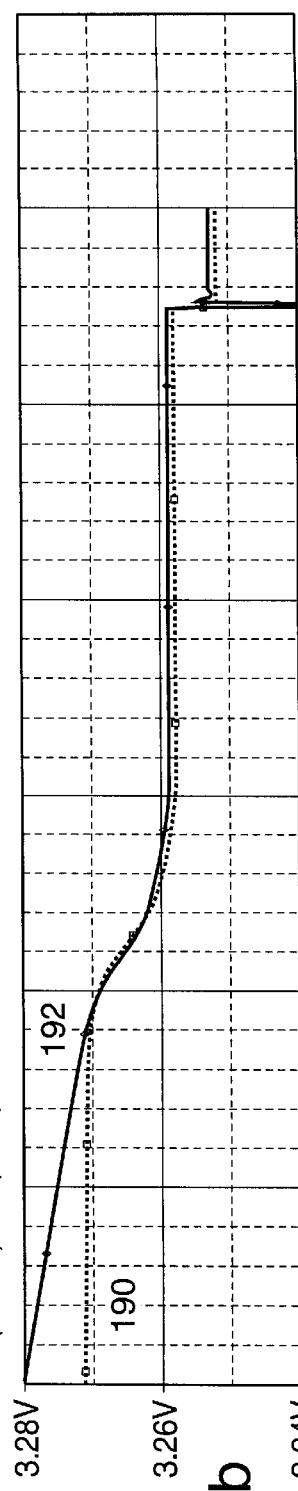
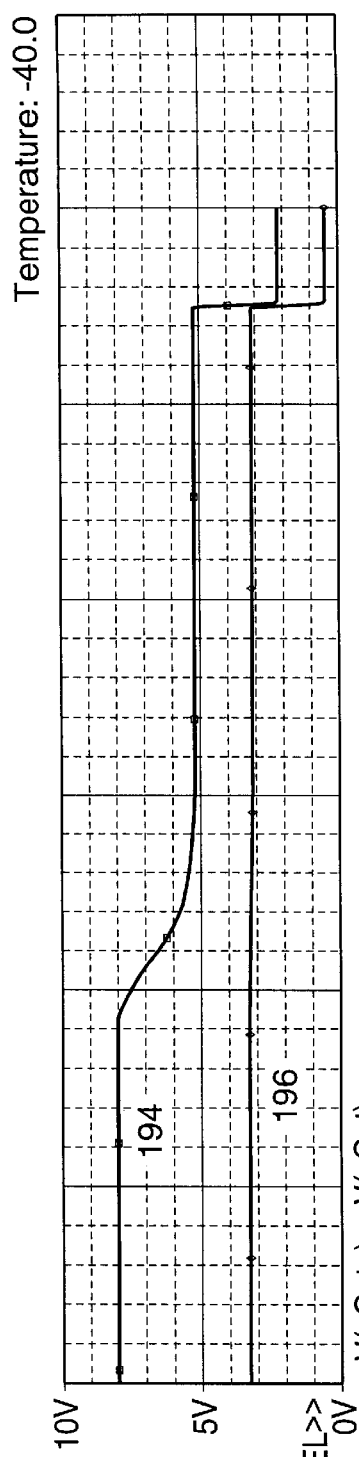
FIG. 12c
FIG. 12b
FIG. 12a

REFERENCE-CORRECTED RATIOMETRIC MOS CURRENT SENSING CIRCUIT

BACKGROUND OF THE INVENTION

1. Field of the Invention

The invention generally relates to current sensing circuits and methods; and in particular, the present invention relates to a ratiometric current sensing circuit for accurately sensing the current flowing through a power-controlling pass device.

2. Background of the Invention

In circuits employing a power switch for power switching or power distribution functions, there is often a need to sense the current passing through the power switch. For example, current sensing is needed to monitor the load current passing through the power switch and the load coupled to the power switch. Current sensing is also needed to control and limit the load current in order to prevent damage to the load or to the power switch itself. Power switches are commonly implemented as n-channel or p-channel MOS devices. Although the current through the power switch can be sensed directly by placing a resistor in series with the power switch, this arrangement is undesirable because the resistor conducts the entire current through the power switch, resulting in a large power dissipation. Instead, a ratiometric current sensing technique is typically used for MOS power switches. In ratiometric current sensing, the current through the power switch is measured using a sense device which matches the power switch in electrical characteristics but is smaller by a known factor. The current through the sense device, which is a known ratio of the current through the power switch, is measured using a resistor connected in series with the sense device. The size of the sense device can be made small enough such that the current through the sense device is measured without undesirable power dissipation.

A conventional ratiometric current sensing circuit for use with a MOS power switch is illustrated in FIG. 1. Current sensing circuit 10 for sensing the current through a power device $M_{Power}$ and a load 13 includes a sense device $M_{Sense}$ and a resistor $R_{Sense}$ connected in series. Power device $M_{Power}$ and sense device $M_{Sense}$ are matching n-channel MOS transistors. Sense device $M_{Sense}$ is chosen to be K times smaller than power device $M_{Power}$. Typically, K is in the range of 1000 or more. The gate terminals of power device $M_{Power}$ and sense device $M_{Sense}$ are connected together and the source terminals of both devices are connected together to a ground terminal (node 15). Therefore, power device $M_{Power}$ and sense device $M_{Sense}$ are driven with identical gate to source voltages. An input voltage $V_{in}$ from an input voltage source 12 is applied across load 13 and power device $M_{Power}$. A load current flowing through load 13 is equivalent to the drain current $I_{DS,P}$ of power device $M_{Power}$.

Resistor $R_{Sense}$ is connected between the drain terminal (node 14) of power device $M_{Power}$ and the drain terminal (node 16) of sense device $M_{Sense}$ and is used to measure the current flowing through the sense device $M_{Sense}$. As long as the voltage across resistor $R_{Sense}$ is small compared to the drain-to-source voltage of $M_{Sense}$, the drain-to-source voltages across power device $M_{Power}$ and sense device $M_{Sense}$ are essentially equal. Since the power device and the sense device have the same drain-to-source voltages and the same gate-to-source voltages, the drain current $I_{DS,S}$ of sense device $M_{Sense}$ is essentially $I_{DS,P}/K$. A voltage drop develops across resistor $R_{Sense}$ which is equal to the product of the drain current $I_{DS,S}$ of sense device $M_{Sense}$ and the resistance of resistor $R_{Sense}$.

The sensed current of sense device $M_{Sense}$ and the sensed voltage of sense resistor $R_{Sense}$ can be used to control circuit protection mechanisms for preventing excessive current flow in power device $M_{Power}$ and load 13. To that end, current sense circuit 10 further includes an error amplifier 20, a reference current source 19, and a reference resistor $R_{Ref}$. Reference current source 19 provides a fixed reference current $I_{Ref0}$ which flows through reference resistor $R_{Ref}$ and generates a reference voltage across the reference resistor. Reference resistor $R_{Ref}$ and sense resistor $R_{Sense}$ are either matching resistors having the same resistance values or resistors having ratioed resistance values. Error amplifier 20 compares the voltage across reference resistor $R_{Ref}$ (node 18) and the voltage across sense resistor $R_{Sense}$ (node 16) and provides a control signal on lead 17 to the gate terminals of sense device $M_{Sense}$ and power device $M_{Power}$. In operation, the reference current $I_{Ref0}$ is selected so as to set the current limit of power device $M_{Power}$. Error amplifier 20 operates to limit the power device's current whenever the sensed voltage at sense resistor $R_{Sense}$ is equal to or exceeds the reference voltage generated by reference resistor $R_{Ref}$. When a current limit condition is detected, error amplifier 20 regulates the gate-to-source voltages of power device $M_{Power}$ and sense device $M_{Sense}$ to limit the current through the sense device to the maximum allowable current value of $I_{Ref0}$.

As mentioned above, in current sense circuit 10 of FIG. 1, as long as the voltage drop across sense resistor $R_{Sense}$ is negligible as compared to the voltage drop across sense device $M_{Sense}$, the drain-to-source voltages across the power device $M_{Power}$ and the sense device $M_{Sense}$ are essentially equal and the current through the sense device tracks the current through the power device. The drain current $I_{DS,P}$ through power device $M_{Power}$ and load 13 is given by:

$$I_{DS,P} <= K*I_{DS,S}*R_{Ref}/R_{Sense},$$

$$= K*I_{Ref0}*R_{Ref}/R_{Sense}.$$

Through the use of a scaled-down sense device, current sensing circuit 10 operates at a low power dissipation level because the sensed current $I_{DS,S}$ is only a fraction of the power device's actual current. Furthermore, current sensing circuit 10 is applicable when the power device is biased either in the saturation region or in the linear (triode) region.

However, conventional current sensing circuit 10 has a significant drawback. In particular, conventional current sensing circuit 10 becomes grossly inaccurate when the power device is operated in the linear region where the drain-to-source voltage across the power device is small. In this case, the voltage drop across the sense resistor is no longer negligible and the drain voltage at the sense device does not track that of the power device. Thus, sense device $M_{Sense}$ grossly underestimates the power device's current.

For sense device $M_{Sense}$ to measure the power device current accurately, the terminal conditions of the two devices should be equal. That is, the gate-to-source voltages and the drain-to-source voltages should be the same for both devices. However, by virtue of the use of sense resistor $R_{Sense}$, some voltage is dropped across the sense resistor. Consequently, the drain voltage at sense device $M_{Sense}$ is less than the drain voltage at power device $M_{Power}$. In the case where the drain-to-source voltage across the power device is large, the voltage drop across the sense resistor is negligible and the drain-to-source voltages of the power and sense devices are essentially equal. However, when the drain-to-source voltage across power device $M_{Power}$ is small, the voltage drop across resistor $R_{Sense}$ is large compared with the drain-to-source voltage of power device $M_{Power}$ such that the drain voltage of the sense device is significantly less than the drain voltage of the power device. The disparity in the drain voltages results in a disparity in the drain current of the two devices such that the sense device grossly underestimates the current flow in the power device.

FIGS. 10*a*–*c* are graphs of the current and voltage characteristics obtained by simulation of the conventional current sensing circuit 20 in FIG. 13. Current sensing circuit 20 is constructed in the same manner as conventional current sensing circuit 10 with the only exception that the load, including load resistor $R_{load}$ having a resistance value of 2 ohms and load voltage source vLoad, is coupled to the source terminal of the power device $M_{out}$. FIGS. 10*a*–*c* illustrate the characteristics of current sensing circuit 20 in response to a linearly ramped load current and to a short-circuit condition at the load. In FIGS. 10*a*–*c*, current sense circuit 20 is operated at an input voltage $V_{in}$ of 3.3 volts. Curve 178 of FIG. 10*a* illustrates the behavior of the load current through load resistor $R_{load}$. Curve 174 of FIG. 10*b* illustrates the gate voltage $V_{Gate}$ as applied to both the sense device and the power device. Curves 170 and 172 of FIG. 10*c* illustrate the voltage at reference resistor $R_{Ref}$ ($V_{Ref}$) and the voltage at sense resistor $R_{Sense}$ ($V_{Sense}$), respectively, with reference to the input voltage $V_{in}$. That is, curve 170 is actually $V_{in}$–$V_{Ref}$ and Curve 172 is $V_{in}$–$V_{Sense}$. Here, reference current source iRef sets the current limit of power device $M_{out}$ to be 250 mA and sets the reference voltage $V_{Ref}$ to 50 mV.

From a time zero to a time 0.75 ms, the load current increases linearly. The gate voltage (curve 174 of FIG. 10*b*) increases to a maximum value of 8 volts to allow the power device $M_{out}$ to carry the necessary load current. Meanwhile, the sensed voltage $V_{Sense}$ slowly increases until the sense voltage $V_{Sense}$ reaches the reference voltage $V_{Ref}$ (50 mV) at a time of 0.5 ms, indicating that the current limit condition is reached. Current sense circuit 20 limits the load current to a value of approximately 609 mA (curve portion 178*a* of FIG. 10*a*), instead of the intended 250 mA current limit. The excessive current limit value under the ramped current condition is caused by sensing inaccuracy when the power device is biased in the linear region. For instance, at about 0.5 ms, the load current is slowly ramped up to about 600 mA. The voltage $V_{out}$ at the source terminal of power device $M_{out}$ is the voltage across load resistor $R_{load}$ and the load voltage source vLoad which is equal to 1.2 volts plus 2.0 volts. Thus, voltage $V_{out}$ is 3.2 volts. The drain-to-source voltage $V_{DS}$ across power device Mout is only 100 mV (3.3 volts of $V_{in}$ minus 3.2 volts of $V_{out}$) and power device Mout is biased in the linear region. In this regime, the 50 mV voltage drop across sense resistor $R_{Sense}$ (denoted R1 in FIG. 13) is significant in comparison with the $V_{DS}$ of the power device (100 mV). The drain-to-source voltage of sense device $M_{Sense}$ is reduced to only 50 mV and does not approximate the drain-to-source voltage of the power device. The drain-to-source voltage disparity causes sense device $M_{Sense}$ to grossly underestimate the power device's current and current sensing circuit 20 does not limit the load current until the load current reaches 609 mA, far exceeding the 250 mA intended current limit.

However, when a short circuit load is applied (at time 0.75 ms), almost the entire input voltage $V_{in}$ of 3.3 volts is applied across power device $M_{out}$ and sense device $M_{Sense}$ and both devices are in saturation. Specifically, voltage Vout is only the voltage drop across the load resistor which is 0.52 volts (260 mA*2 Ω). Thus, the drain-to-source voltage across power device $M_{out}$ is 2.78 volts. The sensed voltage $V_{Sense}$, being 50 mV (curve 172), is only a small fraction (1.7%) of the drain-to-source voltage of the power device. Therefore, under the short-circuit load condition, the disparity between the drain-to-source voltages of the power device and the sense device is small and sense device $M_{Sense}$ can accurately sense the power device's current. Current sense circuit 20 thus limits the current of the power device by lowering the gate voltage (curve 174) to about 1.5 volts. The load current is regulated down to 260 mA (curve portion 178*b* of FIG. 10*a*), closely approximating the intended 250 mA current limit. As can be observed in FIG. 10*a*, the value of the current limit under the ramped current condition is significantly higher than and the current limit under the short-circuit condition. The great disparity in the current limit values (a 135% discrepancy) is an indication of the sensing inaccuracy of the conventional current sensing circuit when the power device is biased in the linear region.

One prior art technique to improve the accuracy of the convention current sensing circuit is illustrated in FIG. 2. In current sensing circuit 30, a bipolar comparator, made up of pnp bipolar transistors 41 and 42, is used to keep the voltage drop across the sense resistor $R_{Sense}$ small. However, current sensing circuit 30 is only able to limit the voltage drop across $R_{Sense}$ to about 10 mV and the result is still unsatisfactory since the values of the current limits between a ramped load current and a short circuit condition still vary by over 60 percent.

Therefore, it is desirable to provide a ratiometric current sensing circuit which can accurately sense the current through a power device for all values of drain-to-source voltages at the power device. In particular, it is desirable to provide a ratiometric current sensing circuit which can sense the current through a power device accurately even when the power device is biased in the linear region.

SUMMARY OF THE INVENTION

A circuit for sensing a first current flowing through a load and a power-controlling pass device is described. In one embodiment, the load and the pass device are connected in series between a first supply voltage and a second supply voltage. The circuit includes a sense device coupled between a first node and the second supply voltage and a sense resistor coupled between the first node and a second node between the load and the pass device. The sense device has a smaller dimension than the pass device. The sense resistor and the sense device carry a second current proportional to the first current and generate a sensed potential across the sense resistor. The circuit further includes a variable reference current source for providing a varying reference current. A reference potential is generated based on the varying reference current and compared with the sensed potential. The varying reference current is varied according to a ratio of the voltage across the sense device to the voltage across the pass device. The current sensing circuit is capable of accurate current sensing when the pass device is operated either in the linear mode or in the saturation mode.

According to one aspect of the present invention, the pass device and the sense device are MOS transistors and the varying reference current is varied according to a ratio of the drain-to-source voltage of the sense device to the drain-to-source voltage of the pass device.

According to another aspect of the present invention, the variable reference current sources includes a first current source for providing a fixed reference current and a computation block for generating the varying reference current. The computation block generates the varying reference current as a function of the fixed reference current scaled by the ratio of the voltage across said sense device to the voltage across said pass device.

In one implementation, the variable reference current source includes a first transconductance amplifier and a second transconductance amplifier for generating a first current and a second current, respectively. The first current has a value indicative of the voltage across the sense device and the second current has a value indicative of the voltage across the pass device. Furthermore, the variable reference current source includes a translinear circuit for generating the varying reference current based on a ratio of the first current to the second current provided by the first and second transconductance amplifiers.

In accordance with the present invention, a transconductance amplifier circuit is provided for use with the current sensing circuit. The transconductance amplifier provides an output current indicative of the voltage difference at its input terminals. The transconductance amplifier includes pnp bipolar transistors for realizing bipolar level shifting functions. The bipolar level shifts establish a voltage across a resistor equaling to the voltage difference at the input terminals of the transconductance amplifier. The current flowing through the resistor is an output current indicative of the voltage difference at the input terminals. The transconductance amplifier operates under a short-circuit load condition to provide accurate current sensing.

The present invention is better understood upon consideration of the detailed description below and the accompanying drawings.

BRIEF DESCRIPTION OF THE DRAWINGS

FIGS. 12a–c illustrate the current and voltage characteristics of the current sensing circuit of FIG. 15.

DETAILED DESCRIPTION OF THE PREFERRED EMBODIMENTS

In accordance with the present invention, a ratiometric MOS current sensing circuit is provided for accurately sensing the load current flowing through a power device operating either in the saturation region or in the linear region. The current sensing circuit of the present invention is particularly suitable for use in USB or PCI bus controller applications where operation of the power device in both the linear and saturated regions is required and where the conventional sensing circuits fail to provide adequate sensing accuracy.

In one embodiment, the current sensing circuit of the present invention corrects for measurement inaccuracies caused by the disparity in the drain-to-source voltages between the sense device and the power device by introducing a varying reference current. The varying reference current is a function of the difference in the drain-to-source voltages between the sense device and the power device. In this manner, the current sensing circuit of the present invention corrects for sensing errors and greatly increases the sensing accuracy when the power device is operated in the linear region, while preserving the sensing accuracy when the power device is operated in the saturation region.

Furthermore, the current sensing circuit of the present invention corrects for sensing errors caused by fabrication process variations and by variations in the operating temperature of the circuit. Fabrication process variations typically result in variations in the on resistance $R_{DS}$ of the power device. Moreover, the on resistance $R_{DS}$ has a positive temperature coefficient. Therefore, the drain-to-source voltage across the power device may vary from device to device due to fabrication process variations, and may vary in operation due to variations in the operating temperatures. The current sensing circuit of the present invention uses the varying reference current to correct for drain-to-source voltage variations in the power device attributable to fabrication process and operating temperature variations. Thus, the current sensing circuit of the present invention is more robust than the conventional current sensing circuit.

Figure 1:
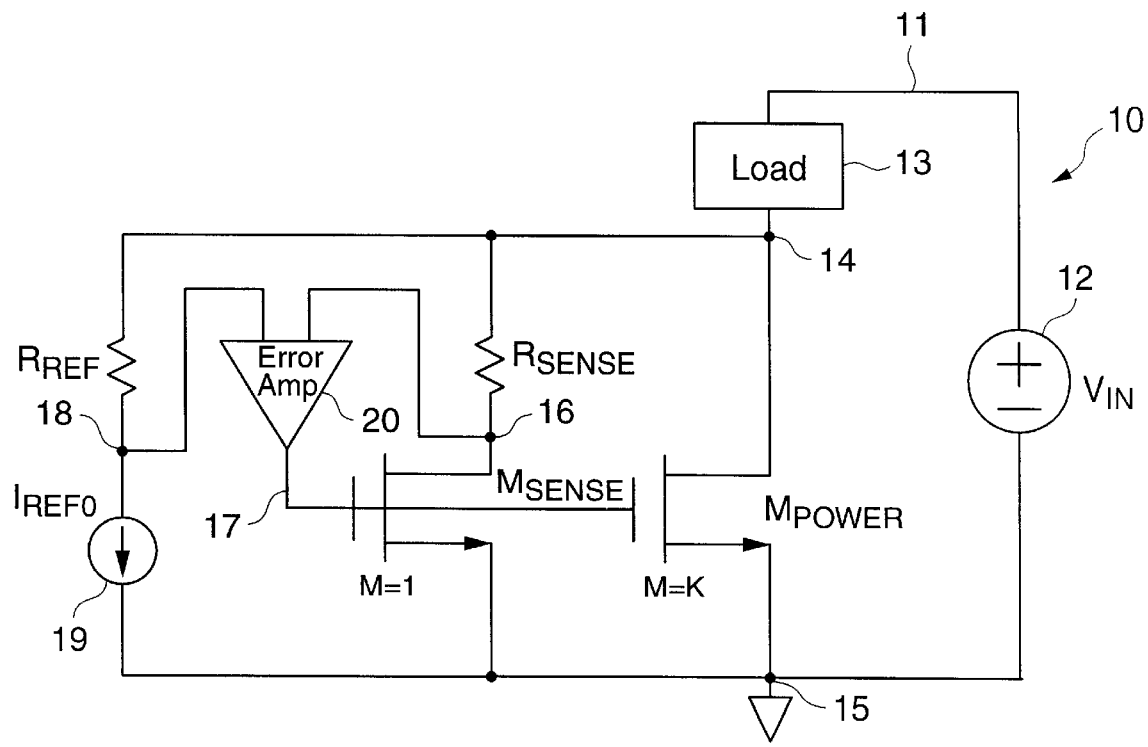
FIG. 1 illustrates a conventional ratiometric current sensing circuit as applied to a MOS power switch.
Figure 2:
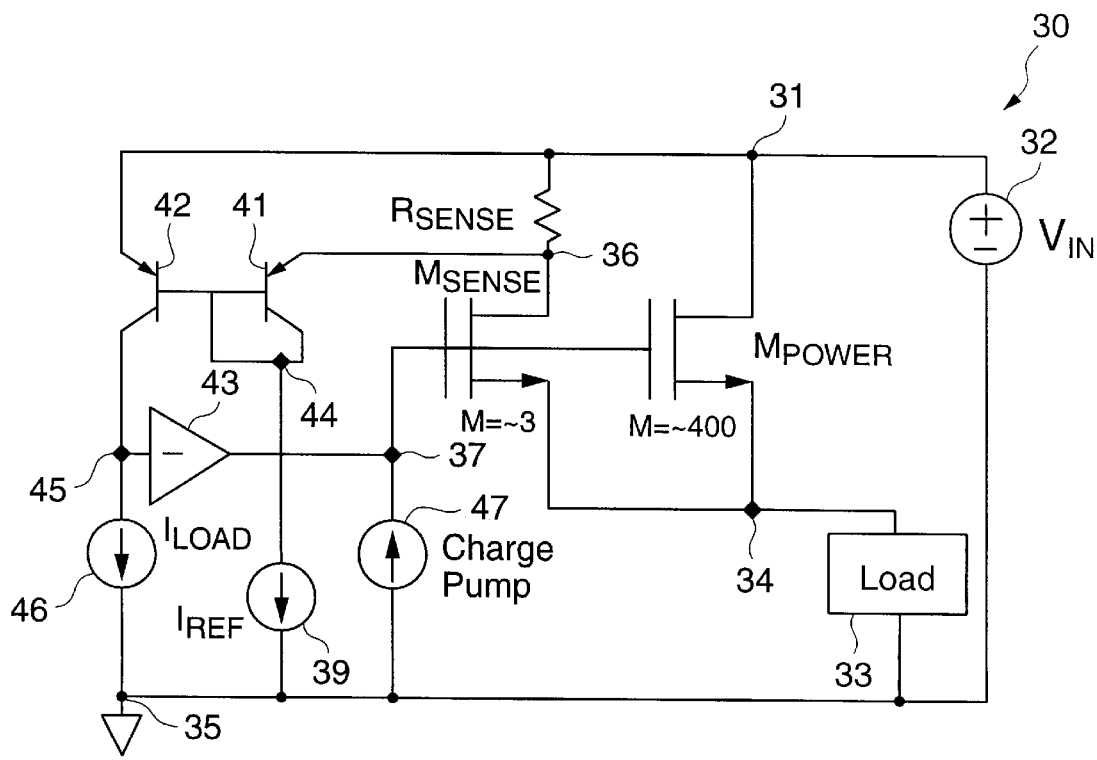
FIG. 2 illustrates another conventional ratiometric current sensing circuit for a MOS power switch.
Figure 3:
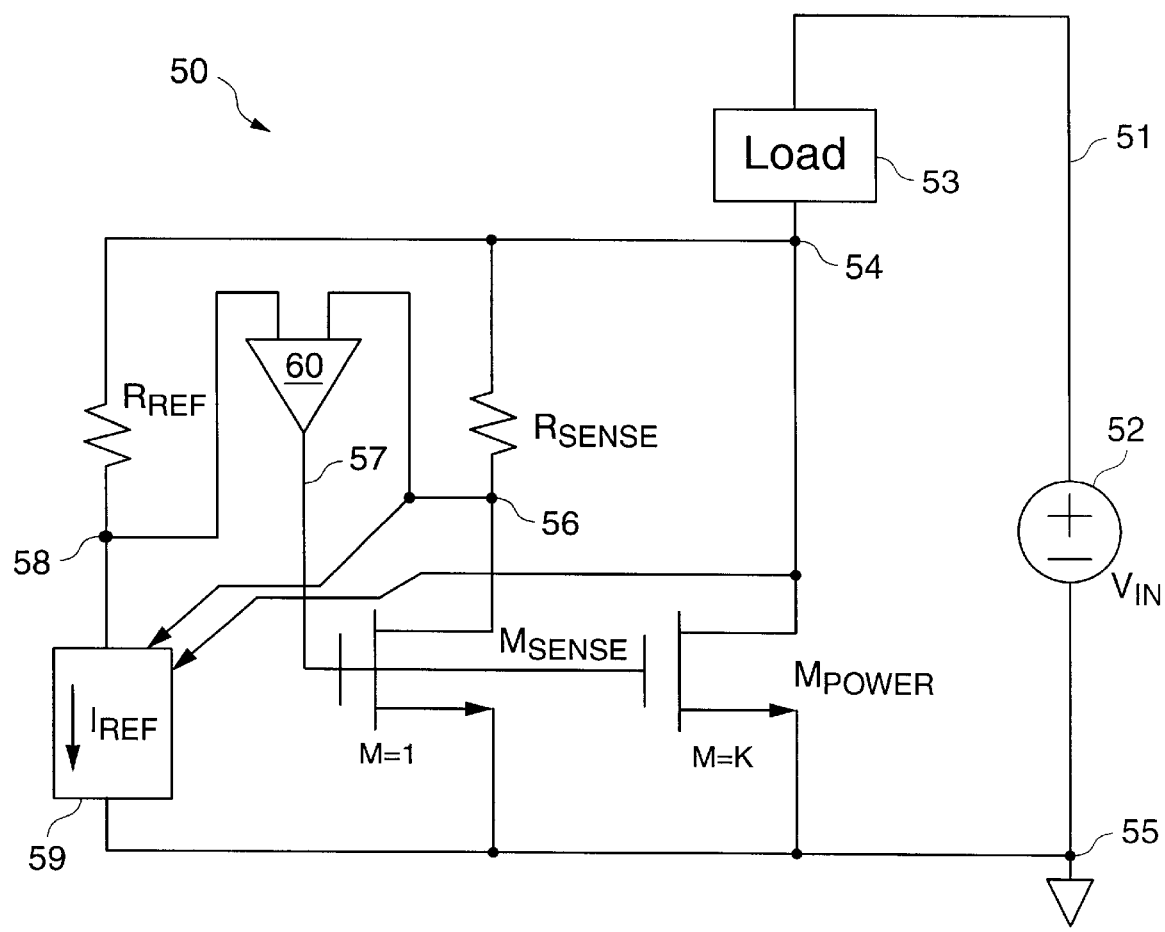
FIG. 3 illustrates a ratiometric current sensing circuit according to one embodiment of the present invention.

FIG. 3 illustrates a ratiometric current sensing circuit according to one embodiment of the present invention. Current sensing circuit 50 senses the drain current $I_{DS,P}$ flowing through a power device $M_{Power}$ and a load 53. An input voltage source 52 applies an input voltage $V_{in}$ to load 53 and power device $M_{Power}$. Current sensing circuit 50 of the present invention utilizes ratiometric current sensing to take advantage of its low power dissipation characteristics. To that end, current sensing circuit 50 includes a sense resistor $R_{Sense}$ and a sense device $M_{Sense}$ connected in series across power device $M_{Power}$, that is, between node 54 and ground node 55. In the present embodiment, power device $M_{Power}$ and sense device $M_{Sense}$ are both n-channel MOS transistors having matching electrical characteristics. Sense device $M_{Sense}$ is sized K times smaller than power device $M_{Power}$ in order to sense a known fraction of the drain current $I_{DS,P}$ flowing through power device $M_{Power}$. The sensed current, that is, the drain current $I_{DS,S}$ of sense device $M_{Sense}$, causes a sensed voltage $V_{Sense}$ to develop across sense resistor $R_{Sense}$ (between nodes 54 and 56). The voltage $V_{Sense}$ is the product of the drain current $I_{DS,S}$ of sense device $M_{Sense}$ and the resistance of resistor $R_{Sense}$.

Current sensing circuit 50 further includes control circuitry for limiting the current $I_{DS,P}$ of power device $M_{Power}$. Specifically, current sensing circuit 50 includes a variable reference current source 59 for generating a varying reference current $I_{Ref}$, a reference resistor $R_{Ref}$ for generating a reference voltage $V_{Ref}$, and an error amplifier 60. Reference resistor $R_{Ref}$ is connected between the drain terminal of power device $M_{Power}$ (node 54) and the current output terminal of variable reference current source 59 (node 58). Reference voltage $V_{Ref}$ between nodes 54 and 58 is the product of varying reference current $I_{Ref}$ and the resistance of reference resistor $R_{Ref}$. Error amplifier 60 is connected to compare the reference voltage $V_{Ref}$ (node 58) with the sensed voltage $V_{Sense}$ (node 56). Error amplifier 60 generates a control voltage signal on lead 57 for driving the gate terminals of sense device $M_{Sense}$ and power device $M_{Power}$. In the present embodiment, sense device $M_{Sense}$ and power device $M_{Power}$ are illustrated as being controlled exclusively by error amplifier 60. This is illustrative only and one of ordinary skill in the art would appreciate that in actual implementation, power device $M_{Power}$ is also controlled by logic signals for realizing the switching function of the power device.

In the present embodiment, current sensing circuit 50 includes control circuitry for setting the current limit of power device $M_{Power}$. The control circuitry described in the present embodiment is illustrative only and is not intended to limit the current sensing circuit of the present invention for use only with a current limiting control circuit. One of ordinary skill in the art, upon being apprised of the principles of the present invention, would know how to apply the current sensing circuit of the preset invention to other control circuitry as well. Also, in the present embodiment, sense resistor $R_{Sense}$ and reference resistor $R_{Ref}$ can be fabricated as implanted resistors, diffused resistors, polysilicon resistors, or other resistor structures known in the art. The resistance values for sense resistor $R_{Sense}$ and reference resistor $R_{Ref}$ can be the same or their resistance values can be ratioed. In one embodiment, the resistance of resistor $R_{Sense}$ is 100 Ω and the resistance of resistor $R_{Ref}$ is 5 kΩ. The resistance ratio is 50.

In current sensing circuit 50, the gate terminals of the power device and the sense device are coupled together and the source terminals of both devices are coupled to ground (node 55). Therefore, power device $M_{Power}$ and sense device $M_{Sense}$ are driven by the same gate-to-source voltage. Except for the voltage drop across sense resistor $R_{Sense}$, power device $M_{Power}$ and sense device $M_{Sense}$ are driven by substantially the same drain-to-source voltage. In accordance with the present invention, the disparity in drain-to-source voltages between the power device and the sense device caused by the voltage drop across the sense resistor $R_{Sense}$ is corrected by providing a varying reference current $I_{Ref}$.

In operation, current sensing circuit 50 decreases varying reference current $I_{Ref}$ to correct for the reduction in drain-to-source voltage of sense device $M_{Sense}$ due to the presence of the sense resistor. The varying reference current according to the present invention is given by the following equation:

$$I_{Ref}=I_{Ref0}*V_{DS,S}/V_{DS,P}, \quad (1)$$

where $I_{Ref0}$ is a fixed reference current chosen to set the current limit of power device $M_{Power}$, assuming negligible voltage drop across the sense resistor; $V_{DS,S}$ is the drain-to-source voltage of sense device $M_{Sense}$; and $V_{DS,P}$ is the drain-to-source voltage of power device $M_{Power}$. The drain current $I_{DS,P}$ of power device $M_{Power}$ is thus given by:

$$I_{DS,P}=K*I_{Ref}*R_{Ref}/R_{Sense}. \quad (2)$$

When the voltage drop across resistor $R_{Sense}$ is large compared with voltage $V_{DS,P}$ of power device $M_{Power}$, such as when power device $M_{Power}$ is biased in the linear region, drain voltage $V_{DS,S}$ of sense device $M_{Sense}$ is appreciably less than drain voltage $V_{DS,P}$ of power device $M_{Power}$. In response, current sensing circuit 50 decreases varying reference current $I_{Ref}$ by the ratio of the drain-to-source voltage of the sense device to that of the power device. The reduction in varying reference current $I_{Ref}$ compensates for the reduction in the drain voltage of the sense device and results in a corresponding decrease in reference voltage $V_{Ref}$ across resistor $R_{Ref}$. Error amplifier 60 compares reference voltage $V_{Ref}$ with sensed voltage $V_{Sense}$ to determine if the current limit is reached. Because reference voltage $V_{Ref}$ is reduced accordingly to account for the reduced drain voltage at sense device $M_{Sense}$, error amplifier 60 is able to accurately limit the current through power device $M_{Power}$ when a current limit condition is detected. According to one aspect of the present invention, the current sensing circuit of the present invention provides for current limit values that are substantially equivalent under both a ramped load condition and a short-circuit load condition, thus allowing for a tighter device specification.

By scaling the fixed reference current $I_{Ref0}$ by the ratio of $V_{DS,S}/V_{DS,P}$ to generate a varying reference current as shown in equation (1), current sensing circuit 50 is able to limit the current through the power device accurately whether the power device is in the saturation region or in the linear region. The sense device does not underestimate the power device's current when the voltage drop across the sense resistor is large. The correction given by equation (1) is satisfactory because the current-voltage (I-V) characteristics in the linear region of a MOS transistor can be closely approximated as a linear I-V relationship. Therefore, the reduction in drain-to-source voltage of the sense device can be approximated closely as a corresponding linear decrease in the drain current of the sense device.

In the embodiment shown in FIG. 3, the load is coupled to the drain terminal of the power device. This load configuration is illustrative only and is not intended to limit the present invention to this particular load configuration. One of ordinary skill in the art would appreciate that the current sensing circuit of the present invention can be used with other load configurations, such as coupling the load to the source terminal of the power device, as described in the embodiments below. The placement of the load relative to power device $M_{Power}$ is not important to the present invention.

Figure 4:
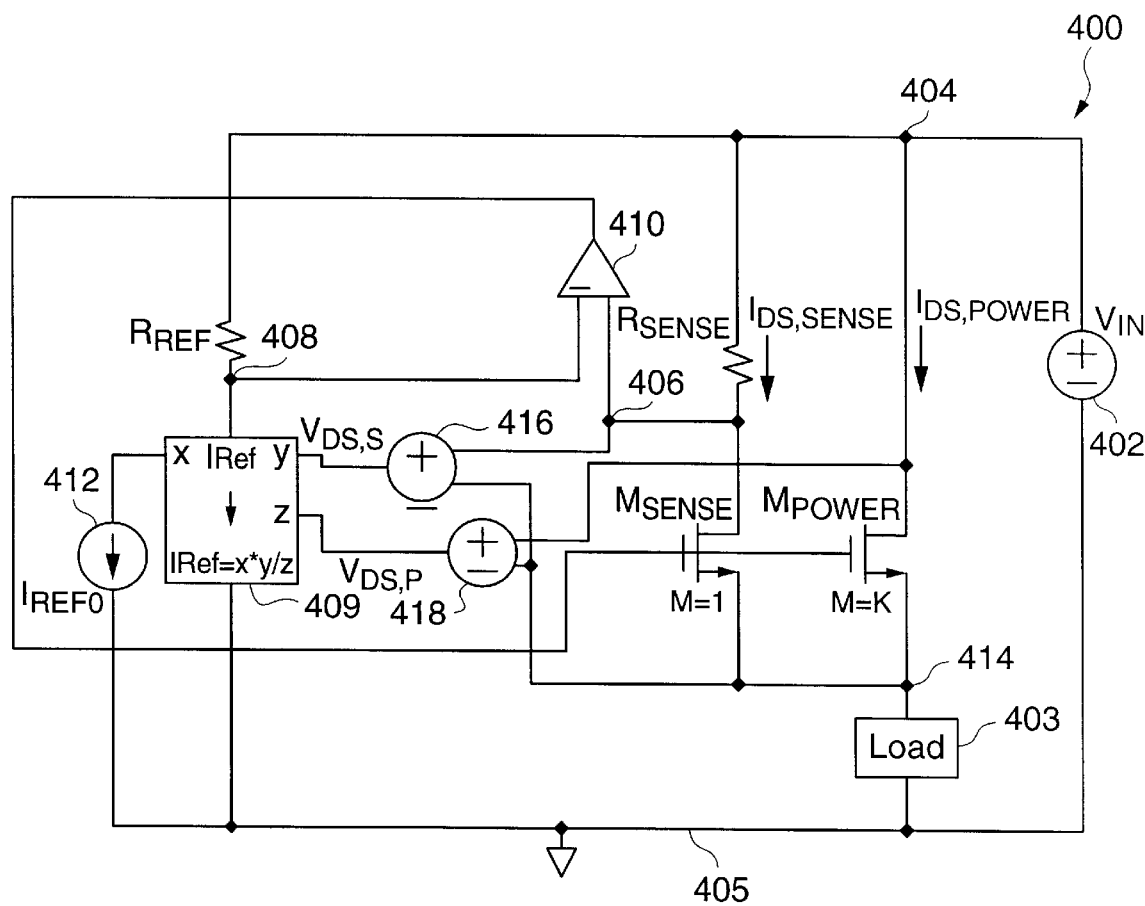
FIG. 4 illustrates a block diagram of a ratiometric current sensing circuit according to one embodiment of the present invention.
Figure 5:
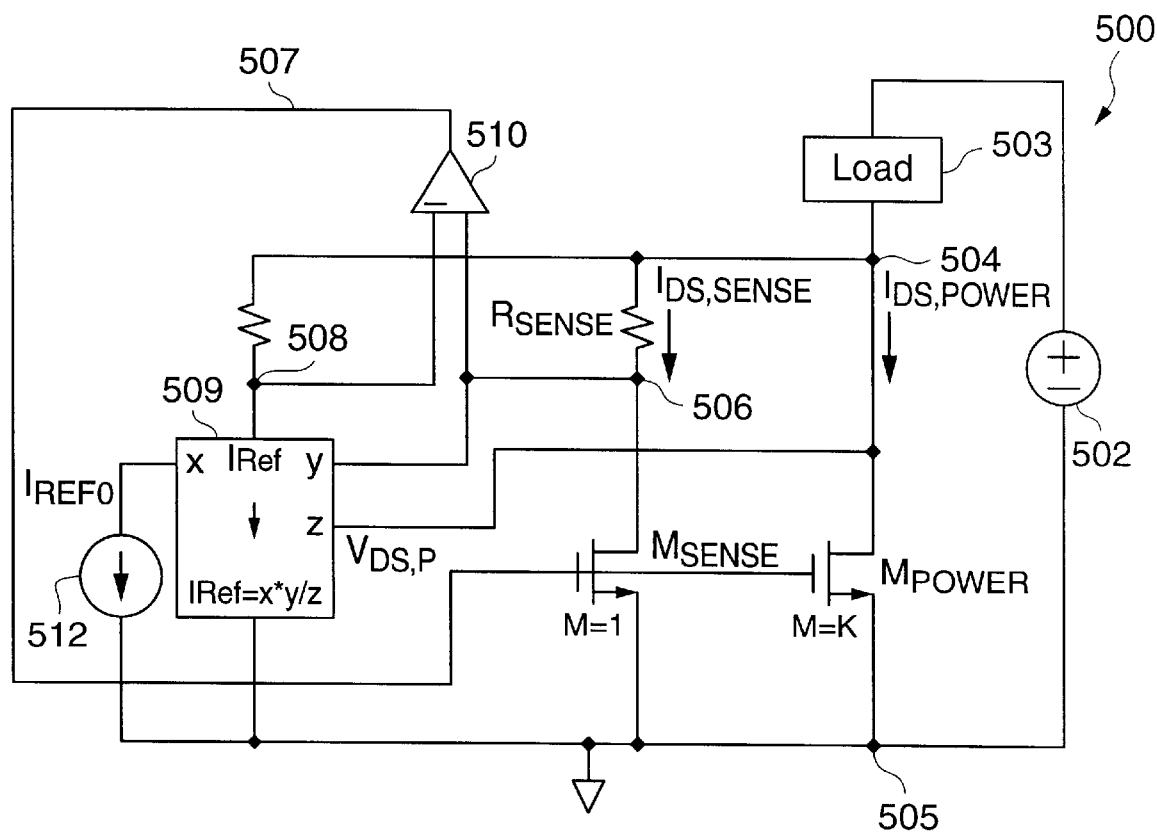
FIG. 5 illustrates a block diagram of a ratiometric current sensing circuit according to another embodiment of the present invention.

FIG. 4 illustrates a block diagram of a ratiometric current sensing circuit according to one embodiment of the present invention. Current sensing circuit 400 includes a power device $M_{Power}$ and a load 403 which is coupled between the source terminal of power device $M_{Power}$ and the ground node 405. Of course, the load can also be connected to the drain terminal of the power device as illustrated in FIG. 5. Current sensing circuit 500 of FIG. 5 operates in the same manner as current sensing circuit 400 of FIG. 4 to accurately sense the load current through the load and the power device.

Returning to FIG. 4, current sensing circuit 400 further includes a sense resistor $R_{Sense}$, a sense device $M_{Sense}$, an error amplifier 410, and a reference resistor $R_{Ref}$ connected in the same manner as current sensing circuit 50 of FIG. 3. An input voltage source 402 applies an input voltage $V_{in}$ across power device $M_{Power}$ and load 403. Implementation of the variable reference current source of current sensing circuit 400 includes a current source 412 for generating a fixed reference current $I_{Ref0}$, a computation block 409 and summers 416 and 418. The value of fixed reference current $I_{Ref0}$ provided by current source 412 is chosen to set the current limit of power device $M_{Power}$. Computation block 409 performs the computation according to equation $I_{Ref}=I_{Ref0}*V_{DS,S}/V_{DS,P}$ of equation (1) above to generate the varying reference current $I_{Ref}$. Computation block 409 has three input terminals for receiving as input signals the fixed reference current $I_{Ref0}$ (on the x input terminal), the drain-to-source voltage $V_{DS,S}$ of sense device $M_{Sense}$ (on the y input terminal), and the drain-to-source voltage $V_{DS,P}$ of power device $M_{Power}$ (on the z input terminal). Computation block 409 computes the value of varying reference current $I_{Ref}$ using the equation $I_{Ref}=x*y/z$ and provides varying reference current $I_{Ref}$ on an output terminal (node 408).

Summers 416 and 418 are used to provide the drain-to-source voltages $V_{DS,S}$ and $V_{DS,P}$ to computation block 409. Basically, the function of the summers is to generate an output signal indicative of the difference between the input signals at the two input terminals. Summer 416 is coupled between the drain terminal (node 406) and the source terminal (node 414) of the sense device while summer 418 is coupled between the drain terminal (node 404) and the source terminal (node 414) of the power device. In current sensing circuit 400 of FIG. 4, summers 416 and 418 are needed to measure the drain-to-source voltages of the sense and power devices because load 403 is coupled to the source terminal (node 414) of power device $M_{Power}$. On the other hand, in current sensing circuit 500 of FIG. 5, no summers are needed to generate the drain-to-source voltages because load 503 is coupled to the drain terminal (node 504) of power device $M_{Power}$ and the source terminals of both sense device $M_{Sense}$ and power device $M_{Power}$ are coupled to the ground terminal (node 505). Therefore, the drain-to-source voltages are simply the voltage at the drain terminals of the sense and power devices (nodes 506 and 504 respectively). Therefore, as illustrated in FIG. 5, the y and z input terminals of computation block 509 of circuit 500 can be connected directly to the drain terminals of the sense device and the power device and no summer circuits are needed.

Figure 6:
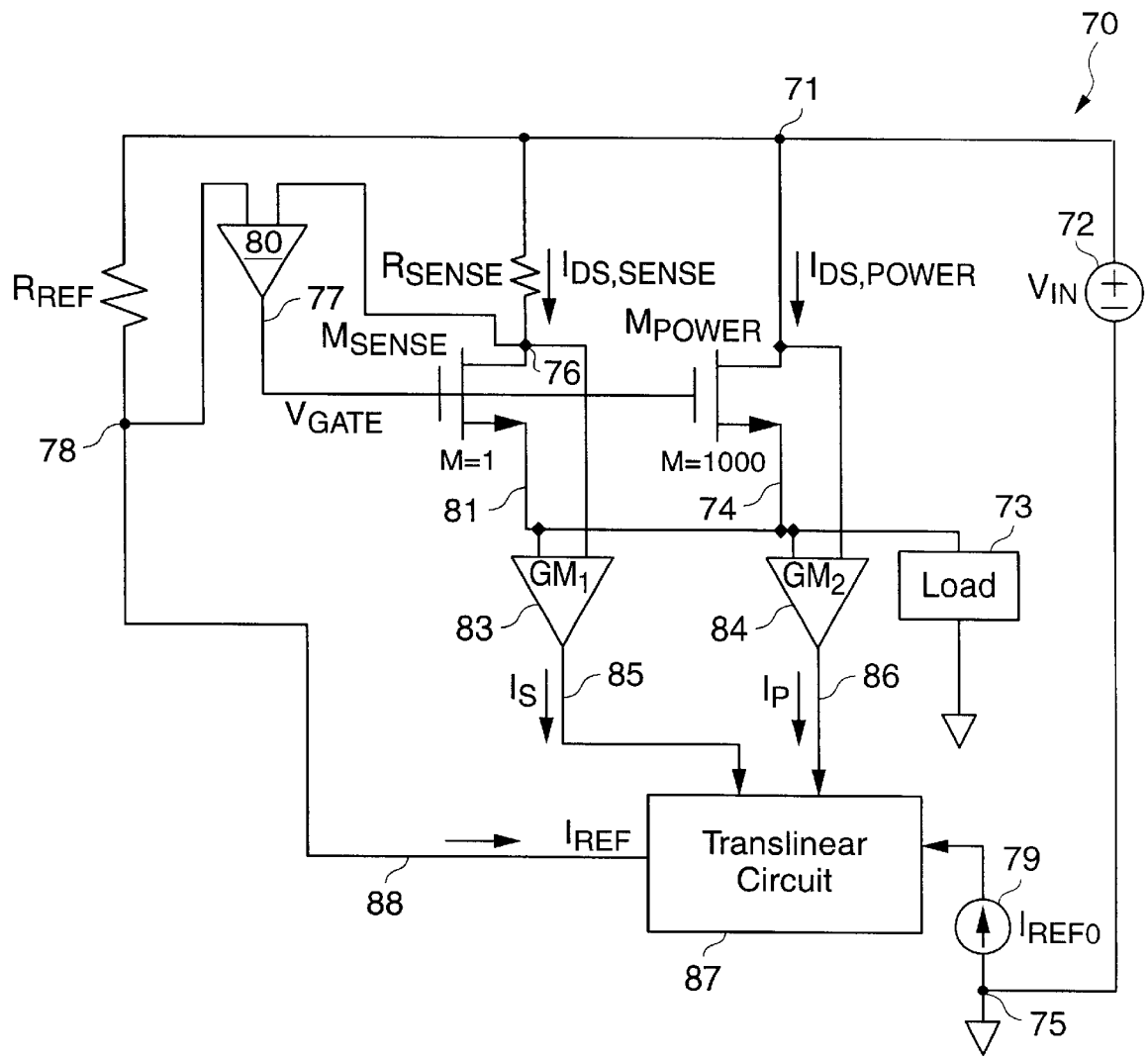
FIG. 6 illustrates an implementation of the ratiometric current sensing circuit according to one embodiment of the present invention.

Computation block 409 of circuit sensing circuit 400 or computation block 509 of circuit 500 can be implemented using any means known in the art for performing the computation stated above to generate a varying reference current $I_{Ref}$. One implementation of the computation block of the current sensing circuit of the present invention is illustrated in FIG. 6. In FIG. 6, current sensing circuit 70 includes a power device $M_{Power}$, a sense device $M_{Sense}$, a sense resistor $R_{Sense}$, a reference resistor $R_{Ref}$, and an error amplifier 80 connected in the same manner as current sensing circuit 400 of FIG. 4. In current sensing circuit 70, transconductance amplifiers 83 and 84 are used to implement the function of the summers in FIG. 4. A transconductance amplifier functions to provide an output current indicative of the difference between two voltage input signals. Transconductance amplifiers 83 and 84 are coupled to the drain and source terminals of sense device $M_{Sense}$ and power device $M_{Power}$, and generate approximator currents $I_S$ (on lead 85) and $I_P$ (on lead 86), respectively. Approximator currents $I_S$ and $I_P$ are proportional to the drain-to-source voltages of the respective sense device and power device. The computation block of current sensing circuit 70 is implemented as a translinear circuit 87 which receives as inputs the two approximator currents $I_S$ and $I_P$ and also a fixed reference current $I_{Ref0}$ from a current source 79. Translinear circuit 87 generates a varying reference current $I_{Ref}$ on current output terminal 88 according to equation (1) above based on the input currents $I_S$, $I_P$, and $I_{Ref0}$. Specifically, translinear circuit 87 computes varying reference current $I_{Ref}$ based on the equation:

$$I_{Ref}=I_{Ref0}*I_S/I_P. \tag{3}$$

Varying reference current $I_{Ref}$ on current output terminal 88 is coupled to reference resistor $R_{Ref}$ at node 78. When varying reference current $I_{Ref}$ flows in reference resistor $R_{Ref}$, a reference voltage $V_{Ref}$ is developed across the reference resistor $R_{Ref}$ at node 78. In current sensing circuit 70, transconductance amplifiers 83 and 84 operate cooperatively with translinear circuit 87 to generate varying reference current $I_{Ref}$ which is proportional to the ratio of the drain-to-source voltage of the sense device to that of the power device.

Figure 7:
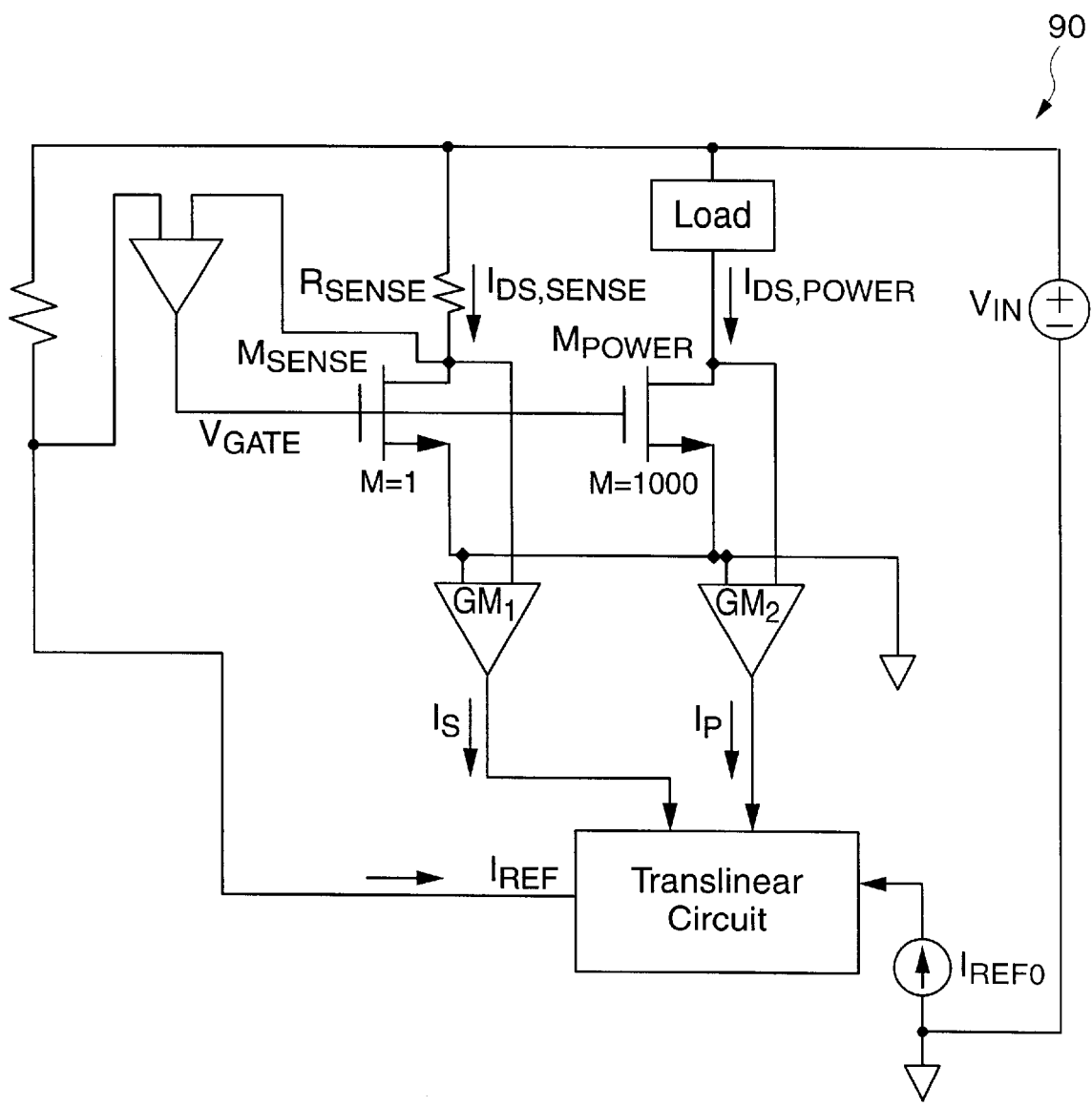
FIG. 7 illustrates an implementation of the ratiometric current sensing circuit according to another embodiment of the present invention.

FIG. 7 illustrates an implementation of the current sensing circuit according to another embodiment of the present invention. Current sensing circuit 90 of FIG. 7 differs from current sensing circuit 70 of FIG. 6 only in the placement of the load relative to the power device. In FIG. 7, the load is coupled to the drain terminal of the power device $M_{Power}$. Although, summer circuits are not needed to generate the drain-to-source voltages of the sense device and the power device, transconductance amplifiers are included in current sensing circuit 90 to generate the approximator currents $I_S$ and $I_P$ which are used by the translinear circuit to generate the varying reference current $I_{Ref}$.

Figure 8:
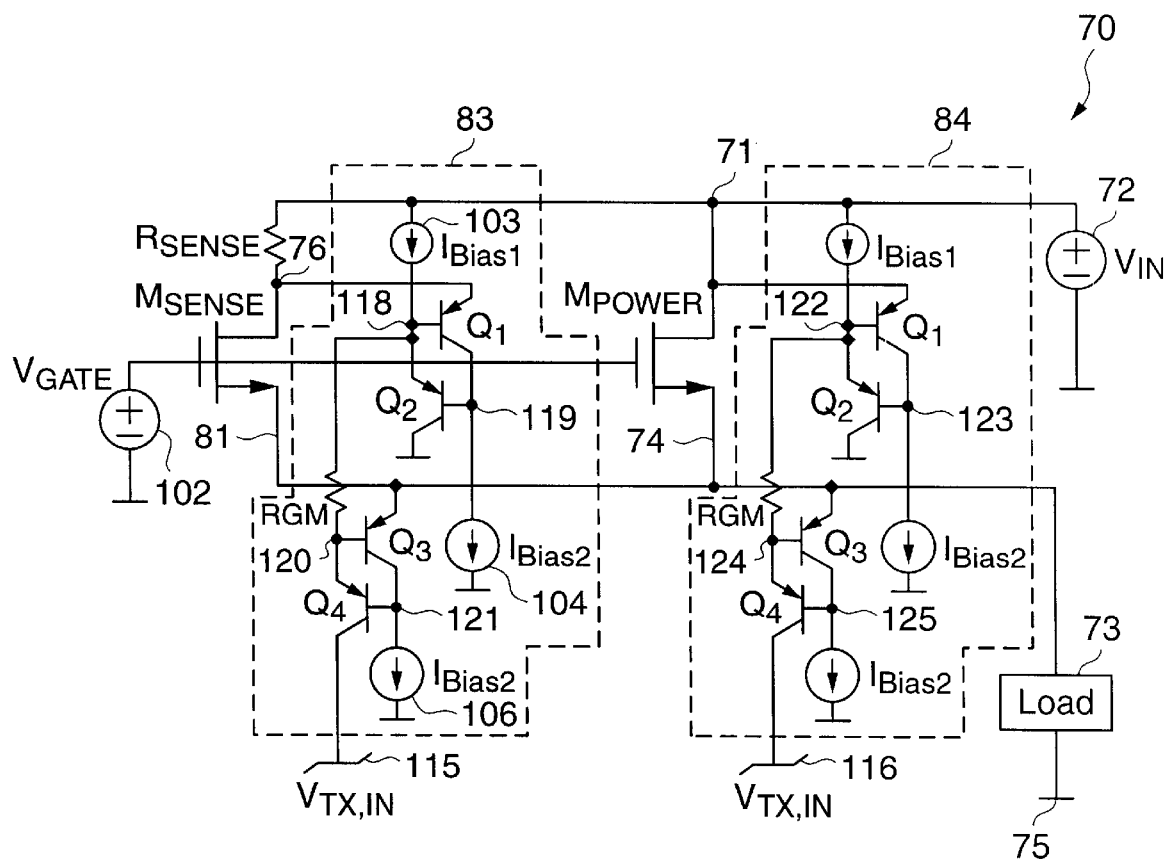
FIG. 8 illustrates an implementation of the transconductance amplifiers of the ratiometric current sensing circuit according to one embodiment of the present invention.
Figure 9:
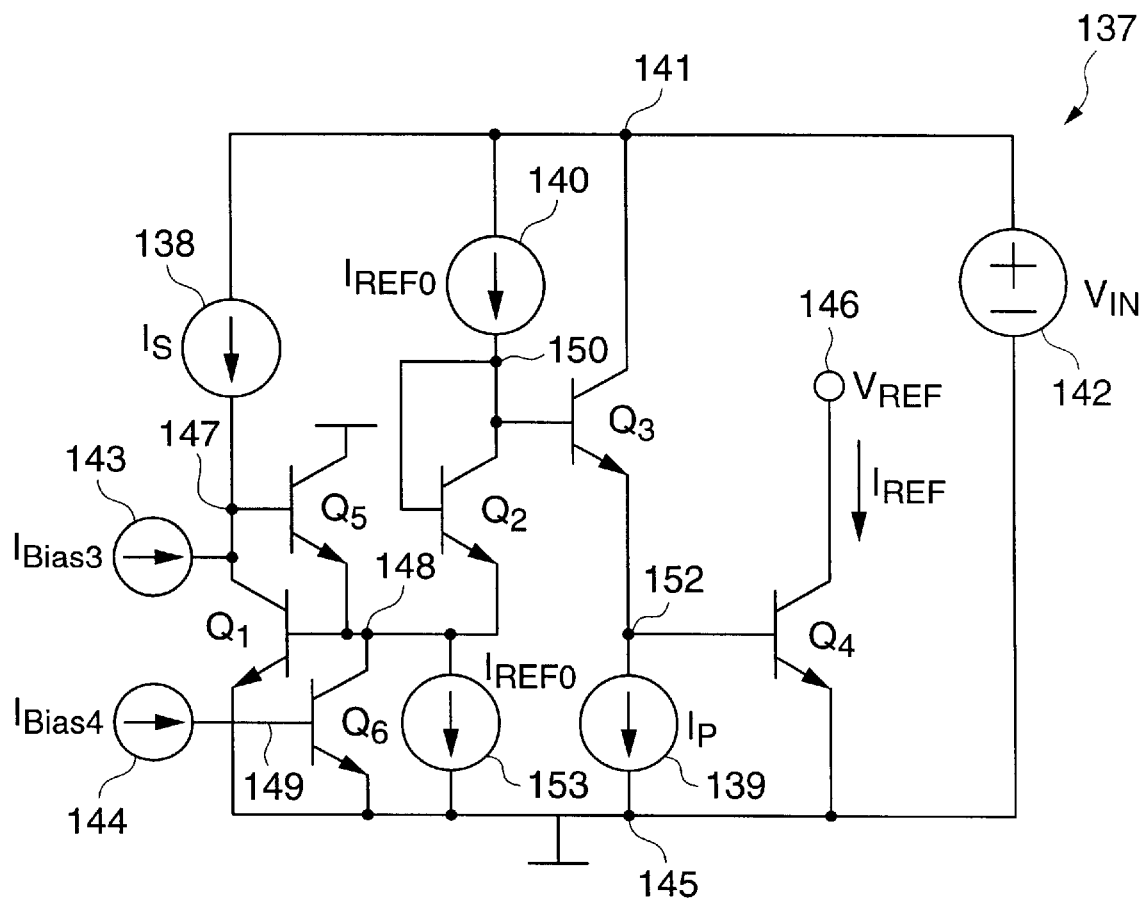
FIG. 9 illustrates an implementation of the translinear circuit of the ratiometric current sensing circuit according to one embodiment of the present invention.

FIGS. 8 and 9 in the following description illustrate detailed implementations of a transconductance amplifier and a translinear circuit, respectively, for use in current sensing circuit 70 or 90 of the present invention. However, the implementations shown in FIGS. 8 and 9 are illustrative only and are not intended to limit the present invention to these particular implementations. Other implementations of the transconductance amplifier and the translinear circuit can be used as long as they meet the operational requirements of the current sensing circuit of the present invention as described below. For example, transconductance amplifier circuits are described in "Analysis and Design of Analog Integrated Circuits," P. Gray and R. Meyer, $3^{rd}$ ed., John Wiley & Sons, 1993. The principle of translinear circuits is described in "Translinear Circuits: A Proposed Classification," B. Gilbert, Electronics Letters, Jan. 9, 1974, Vol. 11, No. 1. The aforementioned references are incorporated herein by reference in their entireties.

As mentioned above, approximator currents $I_S$ and $I_P$, representing the drain-to-source voltages of the sense device and the power device, are generated by transconductance amplifiers 83 and 84 (FIG. 6), respectively. Current sensing circuit 70 of the present invention generates approximator currents $I_S$ and $I_P$ to represent the drain-to-source voltages because translinear circuit 87 can handle computations in currents more readily than in voltages. FIG. 8 illustrates one implementation of a transconductance amplifier which can be used in current sensing circuit 70 of the present invention. However, other configurations of transconductance amplifiers can also be used as long as the combination of transconductance amplifier and the translinear circuit performs the computation function correctly over the entire range of load conditions.

FIG. 8 illustrates a portion of current sensing circuit 70 and detailed implementation of transconductance amplifiers 83 and 84. In FIG. 8, the gate terminals of power device $M_{Power}$ and sense device $M_{Sense}$ are shown connected to a voltage source $V_{GATE}$ 102. Voltage source $V_{GATE}$ 102 is illustrative only. In actual implementation, the gate terminals of power device $M_{Power}$ and sense device $M_{Sense}$ will be connected to the appropriate control circuitry, such as error amplifier 80 in FIG. 6. In current sensing circuit 70, transconductance amplifiers 83 and 84 generate approximator currents $I_S$ and $I_P$ on output terminals 115 and 116, respectively. Output terminals 115 and 116 are coupled to translinear circuit 87 (not shown) which establishes a voltage $V_{TX,IN}$ at each of output terminals 115 and 116.

In current sensing circuit 70, transconductance amplifier 83 has its two input terminals coupled to the drain terminal (node 76) and source terminal (node 81) of sense device $M_{Sense}$ for measuring the drain-to-source voltage $V_{DS,S}$ of the sense device and generating approximator current $I_S$. On the other hand, transconductance amplifier 84 has its two input terminals coupled to the drain terminal (node 71) and source terminal (node 74) of power device $M_{Power}$ for measuring the drain-to-source voltage $V_{DS,P}$ of the power device and generating approximator current $I_P$. In the present embodiment, the source terminals of the sense device and the power device are coupled together and connected to load 73. Therefore, nodes 81 and 74 are the same node electrically but are given separate reference numerals merely to refer to the separate source terminals of each of the sense device and the power device. In current sensing circuit 70, transconductance amplifiers 83 and 84 are constructed in the same way and the constituent elements are given the same reference numerals. Therefore, only transconductance amplifier 83 will be described in detail and it is understood that transconductance amplifier 84 operates in the same manner to generate approximator current $I_P$ on output terminal 116 based on the drain-to-source voltage of power device $M_{Power}$.

Transconductance amplifier 83 includes pnp bipolar transistors Q1, Q2, Q3 and Q4 to realize bipolar level shifting functions for establishing a voltage across a resistor $R_{GM}$ equaling to the potential difference between the input terminals (nodes 76 and 81) of the transconductance amplifier, that is, the drain-to-source voltage of sense device $M_{Sense}$. The current flowing through resistor $R_{GM}$ is the approximator current $I_S$ and is coupled to the emitter terminal of transistor Q4. The approximator current flows through transistor Q4 to the current output terminal 115 (also the collector terminal of transistor Q4) and is provided to the translinear circuit (not shown).

In transconductance amplifier 83, the emitter terminal of transistor Q1 is connected to the drain terminal (node 76) of sense device $M_{Sense}$. The base terminal of transistor Q1 is biased with a current source 103 carrying bias current $I_{Bias1}$. In operation, the voltage at the base terminal of transistor Q1 is one base-to-emitter voltage $V_{BE}$ lower than the drain voltage of transistor $M_{Sense}$. On the other hand, the emitter terminal of transistor Q3 is connected to the source terminal (node 81) of sense device $M_{Sense}$. The base terminal of transistor Q3 is also one $V_{BE}$ lower than the source voltage of transistor $M_{Sense}$.

Transistors Q2 and Q4 set the base current bias conditions for transistors Q1 and Q3 respectively. The base terminals of transistor Q2 and Q4 are each biased by bias current sources 104 and 106, respectively, each carrying a bias current $I_{Bias2}$. The emitter terminal of transistor Q2 is coupled to the base terminal (node 118) of transistor Q1 and the emitter current and the collector current through transistor Q2 are given by:

$$I_{E,Q2} = I_{Bias1} - V_{DS,S}/R_{GM},$$

and $$I_{C,Q2} = I_{E,Q2} * \beta/(\beta+1).$$

The emitter terminal of transistor Q4 is coupled to the base terminal (node 120) of transistor Q3 for generating a collector current through transistor Q4 which is given by:

$$I_{C,Q4} = V_{DS,S}/R_{GM}.$$

In operation, as long as the $V_{BE}$ voltages of transistors Q1 and Q3 are equal, resistor $R_{GM}$ will carry a current equaling to the difference in the emitter voltages of transistors Q1 and Q3 divided by the resistance of resistor $R_{GM}$. The base-to-emitter voltages $V_{BE}$ of transistors Q1 and Q3 are made equal by connecting each of their collector terminals (node 119 and node 121) to bias current sources 104 and 106 having the same bias current value $I_{Bias2}$. As long as the forward current gain $\beta$ of the transistors are large enough, all of bias current $I_{Bias2}$ flow through transistors Q1 and Q3 respectively and the base-to-emitter voltages $V_{BE}$'s of transistors Q1 and Q3 are driven to the same voltage value. In one embodiment, current sources 104 and 106 are constructed as a series of current mirrors, each generating bias current $I_{Bias2}$ by mirroring from an identical reference current source.

Although other transconductance amplifiers may be used in current sensing circuit 70, the transconductance amplifiers illustrated in FIG. 8 in conjunction with the translinear circuit described below is preferred because transconductance amplifier is able to operate under the limiting condition of a short-circuit load. Furthermore, the transconductance amplifier of the present invention is implemented with PNP transistor circuitry which has the advantage of using relatively few elements, resulting in a compact transconductance amplifier circuit which has the benefit of lower power consumption and lower manufacturing cost.

When load 73 is short-circuited, the entire input voltage $V_{in}$ is applied across the power device and the sense device, therefore, the voltage drop across sense resistor $R_{Sense}$ is negligible and the only requirement for proper operation of current sensing circuit 70 is that transconductance amplifiers 83 and 84 output equal current values so that the varying reference current is not perturbed. The absolute values of the approximator currents are immaterial. When current sensing circuit 70 incorporates transconductance amplifiers 83 and 84 according to the implementation shown in FIG. 8, current sensing circuit 70 provides accurate current sensing under all load conditions, including a short-circuited load.

When load 73 is a short-circuit (that is, nodes 81 and 74 are grounded), the emitter terminal (node 81) of transistor Q3 is grounded and the base-to-emitter voltage is too low to turn transistor Q3 on. For best performance, the bias current for transistor Q2 should be large enough such that when the load is short-circuited and the approximator current $I_S$ is at its maximum, transistor Q2 is still biased on. This is achieved by providing a current value for bias current IBiasi (current source 103) that is larger than bias current $I_{Bias2}$. As long as current $I_{Bias1}$ is larger than current $I_{Bias2}$, the current flowing through resistor $R_{GM}$ equals to $\beta*I_{Bias2}$. In one embodiment, $I_{Bias1}$ is 23.2 µA and $I_{Bias2}$ is 5.8 µA. Because both transconductance amplifiers 83 and 84 have the same bias current values $I_{Bias1}$ and $I_{Bias2}$, and the same resistance value for resistor $R_{GM}$, both amplifiers current output nearly equal amount of approximator currents $I_S$ and $I_P$ at their respective output terminals 115 and 116 under a short-circuited load condition.

The near-equality current condition of amplifiers 83 and 84 under a short-circuit load condition is also guaranteed because transistor $Q_4$ in each amplifier 83 or 84 sees approximately the same terminal conditions when the load is short-circuited. Specifically, the collector terminal of transistor Q4 is biased to a voltage value of $V_{TX,IN}$ by the translinear circuit (not shown). The emitter terminal of transistor Q4 is coupled to resistor $R_{GM}$ which is coupled to the base terminal of transistor Q1. The only difference between amplifier 83 and amplifier 84 is that the voltage at the emitter terminal of transistor Q1 of amplifier 83 is lower by the voltage across sense resistor $R_{Sense}$. When load 73 is shorted, the voltage across sense resistor $R_{Sense}$ is the current limit threshold voltage which is small in comparison to the voltage across the sense device or the power device. Therefore, transconductance amplifiers 83 and 84 will output virtually equal currents under the condition of a short-circuit load. In one embodiment, voltage $V_{in}$ is 3.0 volts, voltage $V_{TX,IN}$ is 1.4 volts, and $V_{Sense}$ is 50 mV. Then, the voltage drops across resistors $R_{GM}$ of amplifiers 83 and 84 differ only by 50 mV out of 1.6 volts, or 3 percent. Thus, amplifiers 83 and 84 output almost equal approximator current values and current sensing circuit 70 operates properly in response to the short-circuited load condition.

In current sensing circuit 70, the inclusion of transconductance amplifier 83 causes an additional voltage drop across resistor $R_{Sense}$ attributed to the emitter bias current of transistor $Q_1$, that is, current $I_{Bias2}$ The voltage drop caused by current $I_{Bias2}$ results in further reduction of the drain voltage of sense device $M_{Sense}$ that is not present in the source voltage of the sense device. In order to correct for the additional voltage drop at the drain terminal of the sense device due to current $I_{Bias2}$, a resistor having equal resistance as resistor $R_{Sense}$ can be inserted between the source terminal of the sense device and the emitter terminal of transistor $Q_3$ in transconductance amplifier 83. By so doing, an equal voltage drop ($I_{Bias2}*R_{Sense}$) is added to the voltage at node 120, thereby keeping the drop across resistor $R_{GM}$ equal to the drain-to-source voltage of the sense device. Although the voltage drop across resistor $R_{Sense}$ due to current $I_{Bias2}$ is small because current $I_{Bias2}$ is small (e.g. 5.8 μA) so that correction is not necessary, the addition of the matching resistor to transistor Q3 of transconductance amplifier 83 further improves the accuracy of current sensing circuit 70. This implementation is shown in the current sensing circuit of FIG. 15 where resistor R22 is the matching resistor added to match the voltage drop across sense resistor $R_{Sense}$ due to biase current $I_{Bias2}$ (iBb3 in FIG. 15). Both resistors $R_{Sense}$ and R22 have a resistance value of 100 Ω.

Turning now to the implementation of the translinear circuit. FIG. 9 illustrates one embodiment of a translinear circuit 137 for use with the current sensing circuit of the present invention. In operation, translinear circuit 137 computes the correction function $I_{Ref} = I_{Ref0}*I_S/I_P$ stated in equation (3) above by operating on the base-to-emitter voltages $V_{BE}$ generated by npn bipolar transistors Q1, Q2 and Q3. Because the base-to-emitter voltage of a bipolar transistor is a function of the logarithm of the collector current, multiplication and division in collector currents can be carried out as addition and subtraction using base-to-emitter voltages. To compute the correction function of equation (3) above in translinear circuit 137, approximator current $I_S$ is multiplied to fixed reference current $I_{Ref0}$ by adding the $V_{BE}$'s of transistors Q1 and Q2. Then, the $I_S$ and $I_{Ref0}$ product is divided by approximator current $I_P$ by subtracting the $V_{BE}$ of transistor Q3 from the sum. The resulting varying reference current $I_{Ref}$ is outputted by an output stage (transistor Q4) which provides current $I_{Ref}$ at the collector terminal (node 146) of transistor Q4. Current $I_{Ref}$ is coupled to the control circuitry such as reference resistor $R_{Ref}$ and error amplifier 80 of FIG. 6.

As stated above, translinear circuit 137 includes three basic computational components. First, approximator current $I_S$ from the transconductance amplifier coupled to the sense device (amplifier 83 in FIG. 8) is coupled to the collector terminal (node 147) of npn transistor Q1. In FIG. 9, approximator current $I_S$ is represented by current source 138 in translinear circuit 137. Current source 138 is illustrative only and does not imply that a separate current source is needed in translinear circuit 137 to generate current $I_S$. Assuming a large gain β for transistor Q1 and assuming that the base current into npn transistor Q5 is negligible, then all of approximator current $I_S$ goes through transistor Q1 and the base-to-emitter voltage ($V_{BE}$) of transistor Q1 is determined solely by approximator current $I_S$.

Translinear circuit 137 further includes npn transistors Q5 and Q6 for setting the base bias level of transistor Q1. Transistor Q6 has its base terminal (node 149) coupled to a bias current source 144 carrying a bias current $I_{Bias4}$. Thus, the collector current of transistor Q6 is $\beta*I_{Bias4}$. The collector terminal of transistor Q4 is coupled to the base terminal (node 148) of transistor Q1. Furthermore, the base terminal (node 148) is coupled to a current source 153 carrying fixed reference current $I_{Ref0}$. Current source 153 is added to cancel out the $I_{Ref0}$ current through transistor Q2, thus ensuring that transistor Q5 is biased solely by the collector current of transistor Q6. Transistor Q5, connected in series with transistor Q6, has a collector current of $\beta*I_{Bias4}$. Transistor Q5 drives the base terminal of transistor Q1 and functions to ensure that transistor Q1 is turned on sufficiently so that all of approximator current $I_S$ goes through transistor Q1. Because the base terminal of transistor Q5 is coupled to the collector terminal of transistor Q1, transistor Q5 draws a base current of $I_{Bias4}$ from the approximator current $I_S$. To compensate, a current source 143 is provided to inject a current $I_{Bias3}$ into the base terminal of transistor Q5 (node 147) so that all of the approximator current $I_S$ is provided to transistor Q1. Current $I_{Bias3}$ is equal to or greater than current $I_{Bias4}$. In one embodiment, current $I_{Bias4}$ is 145 nA and current $I_{Bias3}$ is 165 nA. The advantage of setting current $I_{Bias3}$ greater than current $I_{Bias4}$ is that the additional current in $I_{Bias3}$ ensures that even if approximator current $I_S$ is zero, transistors Q5 and Q1 are still biased on.

In the second computation stage, fixed reference current $I_{Ref0}$ is coupled to the collector and base terminals (node 150) of npn transistor Q2. In FIG. 9, fixed reference current $I_{Ref0}$ is represented by current source 140 which is illustrative only. Fixed reference current $I_{Ref0}$ is an input current provided to translinear circuit 137 and is not generated by a separate current source inside the translinear circuit. Again, assuming that the gain β of transistor Q2 is large and that the base current into Q2 is negligible, all of fixed reference current $I_{Ref0}$ are carried through the collector terminal of transistor Q2 and the $V_{BE}$ of transistor Q2 is determined solely by fixed reference current $I_{Ref0}$. Transistors Q1 and Q2 of the first two computation stages are stacked so that their $V_{BE}$'s add up at node 150, representing the product of $I_{Ref0}$ and $I_S$.

In the third and last computation stage, approximator current $I_P$ of the power device is coupled to a current mirror which reverses the polarity of approximator current $I_P$ and draws current $I_P$ from the emitter terminal (node 152) of npn transistor Q3. The current mirror is represented by current source 139. Again, assuming that the gain β is large and that the base current in transistor Q3 is negligible, the $V_{BE}$ of transistor Q3 is determined entirely by approximator current $I_P$. The division operation of current $I_P$ is realized by subtracting the $V_{BE}$ of transistor Q3 from the sum of the $V_{BE}$ of transistor Q1 and Q2 (node 150). The emitter voltage (node 152) of transistor Q3 is the resulting output $V_{BE}$ voltage.

At the output stage, the resulting output $V_{BE}$ voltage at the emitter terminal (node 152) of transistor Q3 is applied to the base terminal of transistor Q4 which converts the output voltage into a collector current at node 146. The collector current of transistor Q4 is the varying reference current $I_{Ref}$ which is coupled to the control circuitry of the current sensing circuit of the present invention.

As described above, in translinear circuit 137, current source 139 is created for drawing a current equaling approximator current $I_P$ from the emitter terminal of transistor Q3. Current source 139 needs to be designed so as to ensure that in the limiting condition of a short-circuited load, approximator currents $I_S$ and $I_P$ are equal. Specifically, current source 139 needs to be designed so that at the short-circuited load condition, output terminals 115 and 116 (FIG. 8) are biased to the same voltage level. Referring to FIG. 9, approximator current $I_S$ (current source 138) coupled to node 147 of translinear circuit 137 is biased to two $V_{BE}$ voltages ($V_{BE}$ of transistor Q5 and $V_{BE}$ of transistor Q1). Accordingly, current source 139 needs to be designed so that approximator current $I_P$ is also biased to two $V_{BE}$ voltages.

Figure 14A:
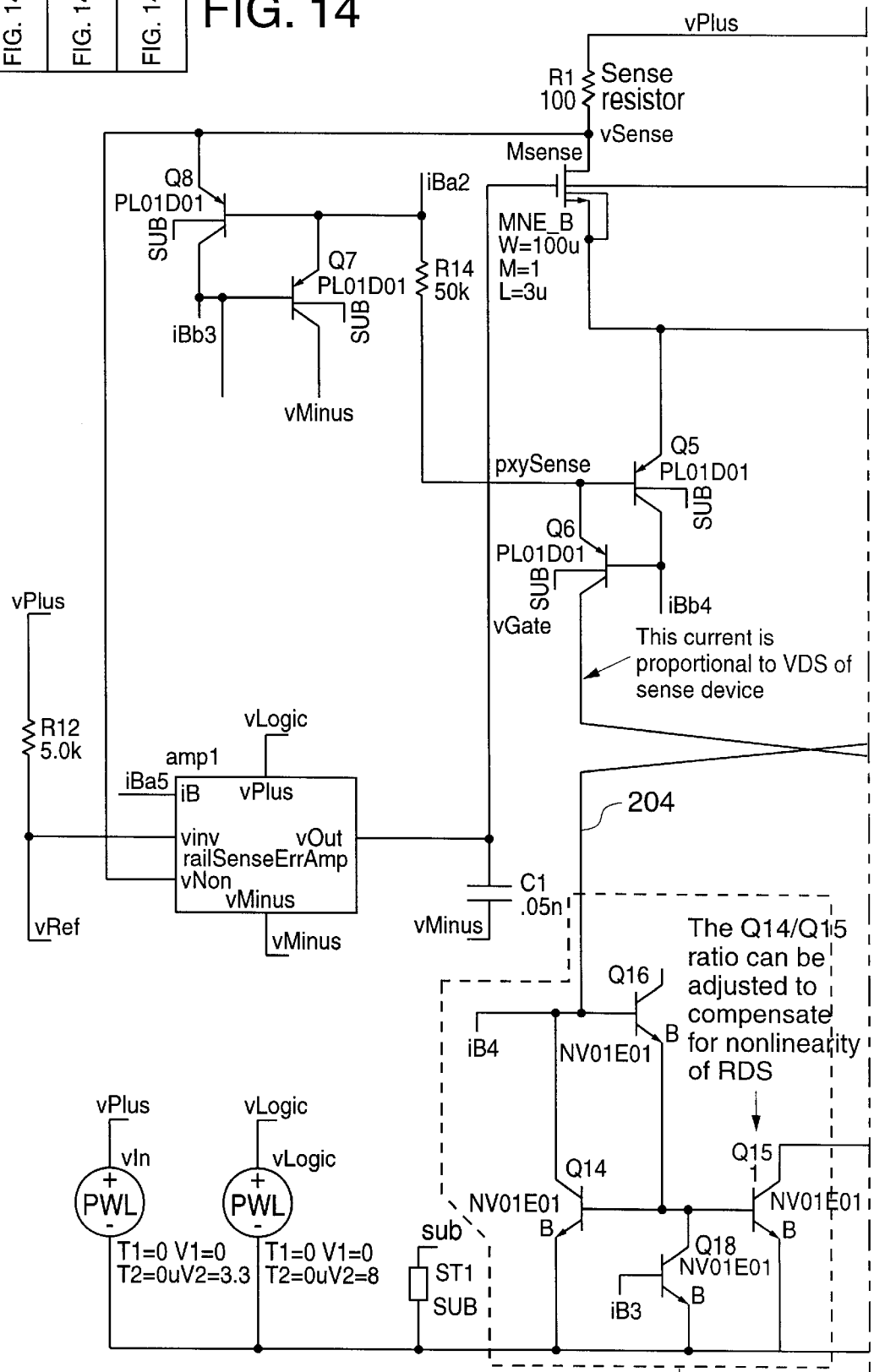
FIG. 14, consisting of FIGS. 14a, 14b and 14c, illustrates a detailed implementation of a current sensing circuit according to one embodiment of the present invention.
Figure 14B:
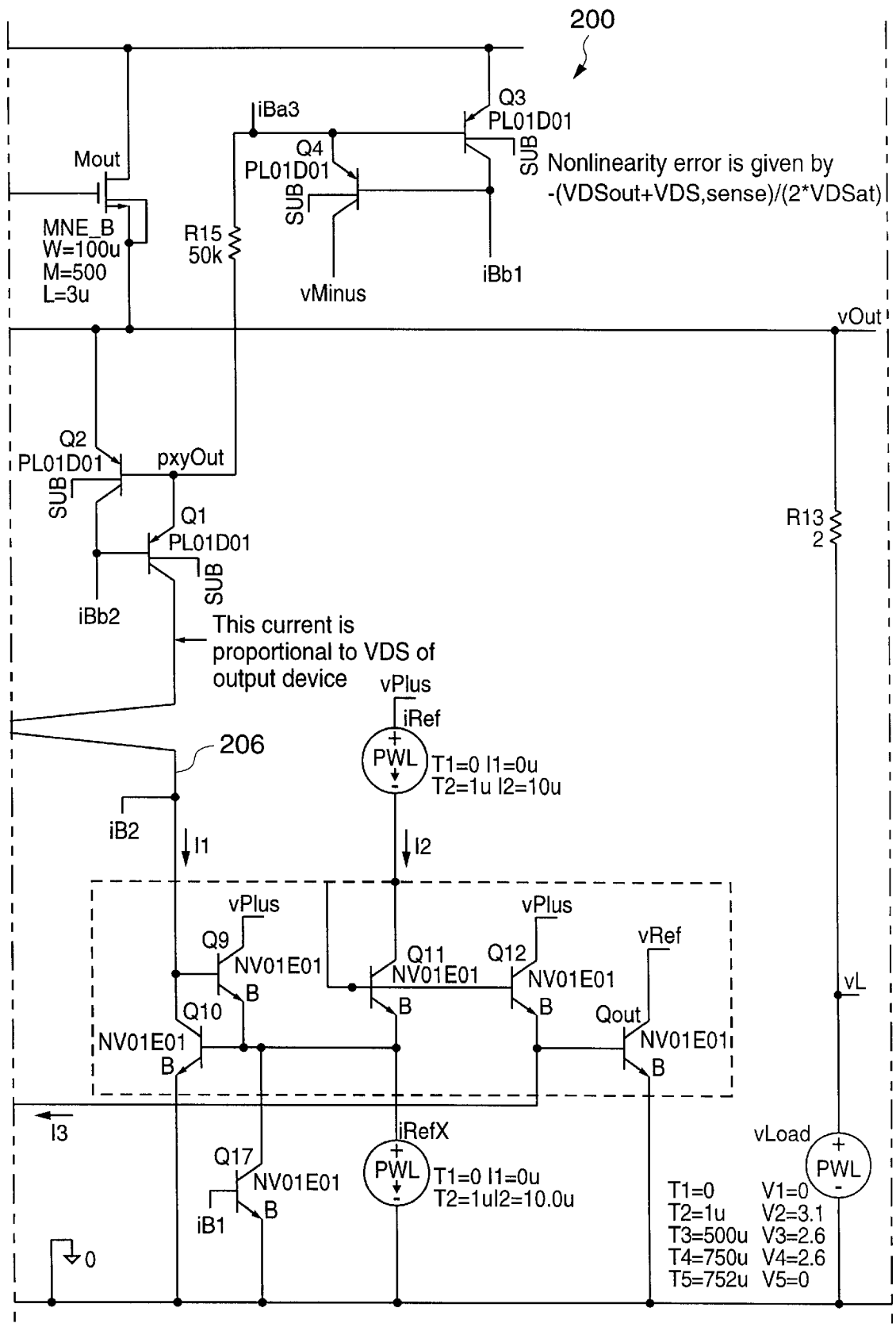
Figure 14C:
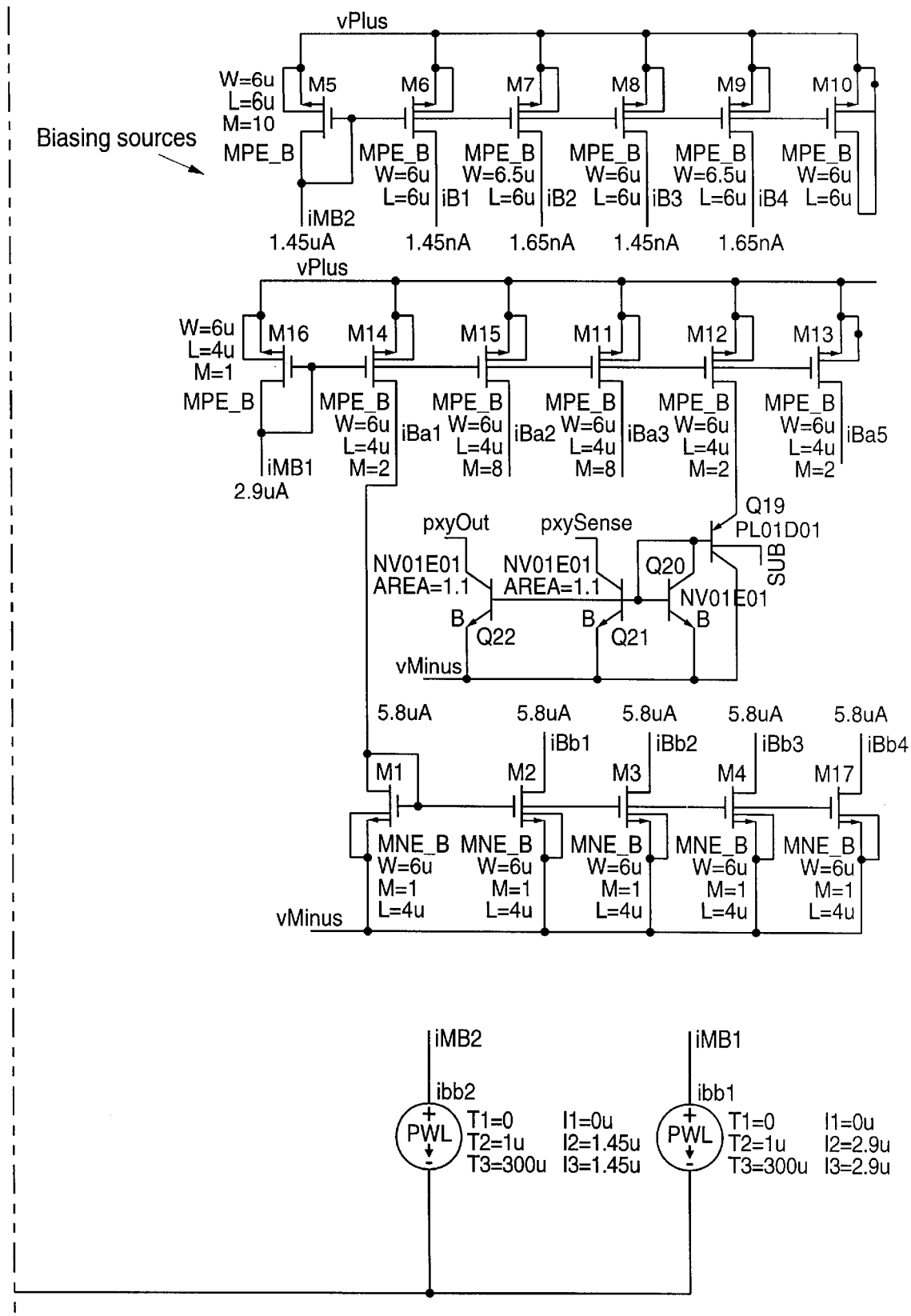

FIG. 14 illustrates a detailed implementation of a current sensing circuit according to the present invention, including an implementation of the current mirror in the translinear circuit. Referring to FIG. 14, current mirror 239 includes npn bipolar transistors Q14, Q15, Q16 and Q18. Approximator current $I_P$ is coupled to current mirror 239 on lead 204 and is coupled to the base terminal of transistor Q16. Transistors Q16 and Q14 are cascaded so that approximator current $I_P$ on lead 204 sees two $V_{BE}$ voltages, i.e., the $V_{BE}$ of transistor Q16 and the $V_{BE}$ Of transistor Q14. In this manner, current mirror 239 ensures that approximator currents $I_S$ and $I_P$ are biased with the same terminal voltages even under the limiting condition of a short-circuited load. In the present embodiment, the terminal voltage $V_{TX,IN}$ set by the translinear circuit at output terminals 204 and 206 is two base-to-emitter voltages, i.e. approximately 1.4 volts. Transistor Q15 establishes a current mirror function with transistor Q14 and acts to sink approximator current $I_P$ (denoted as $I_3$ in FIG. 14) from transistor Q12 (same as transistor Q3 in FIG. 9) of the translinear circuit.

Figure 11C:
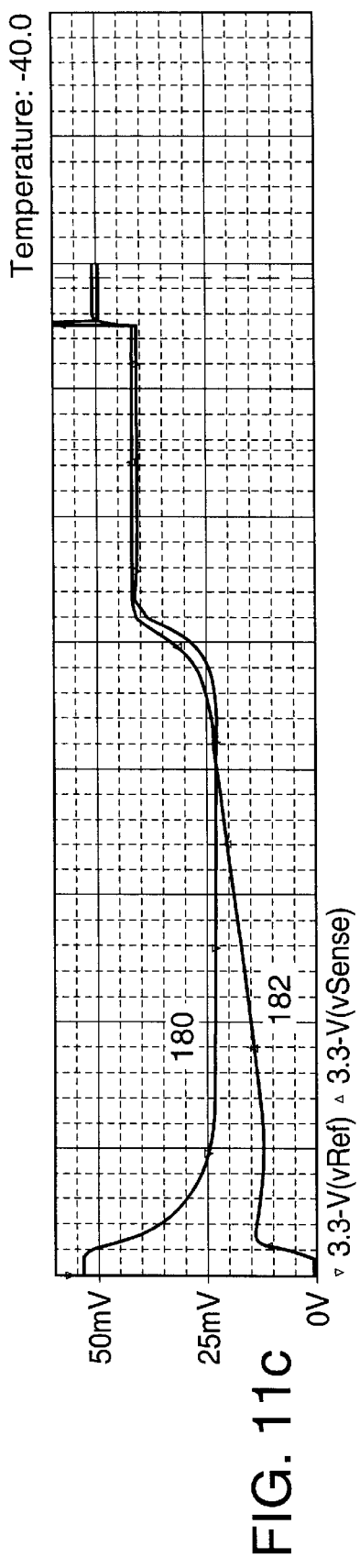
FIGS. 11a–c illustrate the current and voltage characteristics of the current sensing circuit of FIG. 14.
Figure 11B:
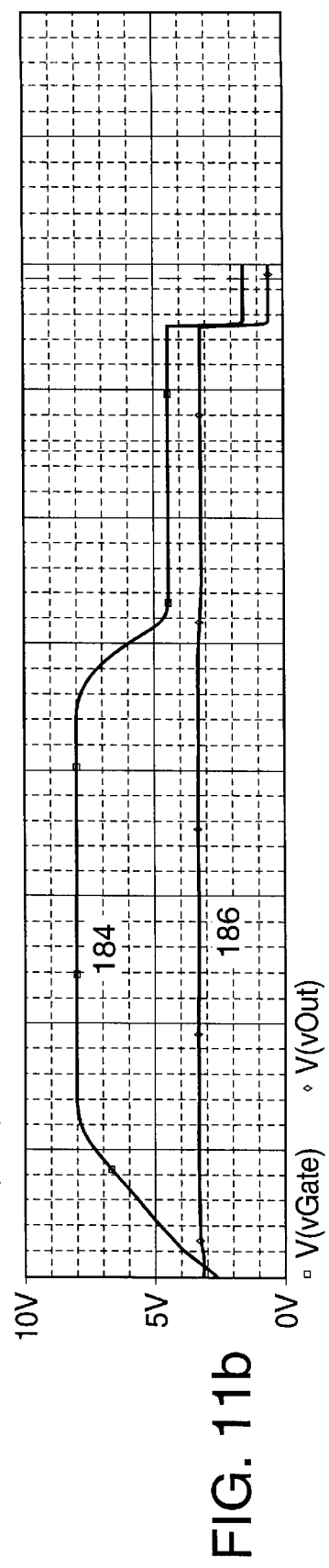
Figure 11A:
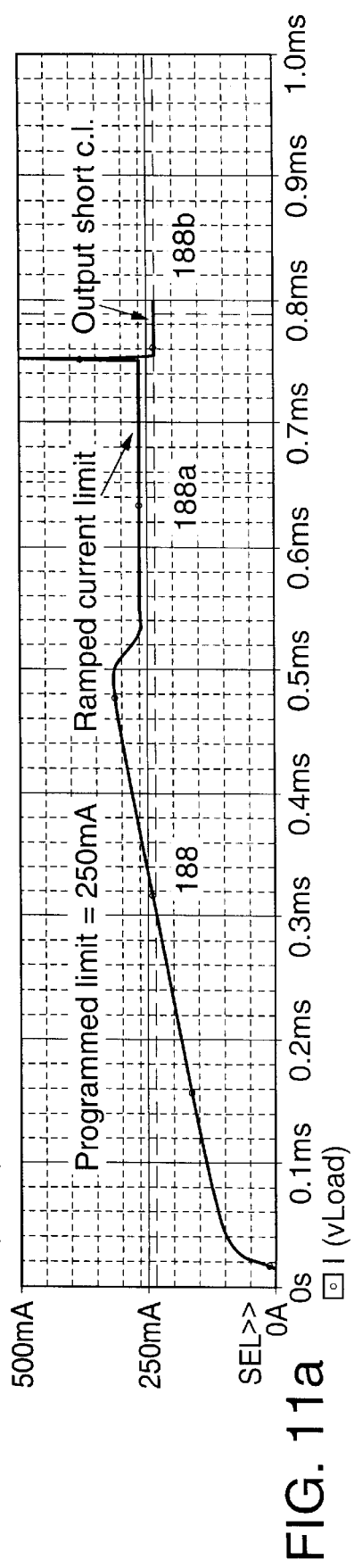
Figure 13:
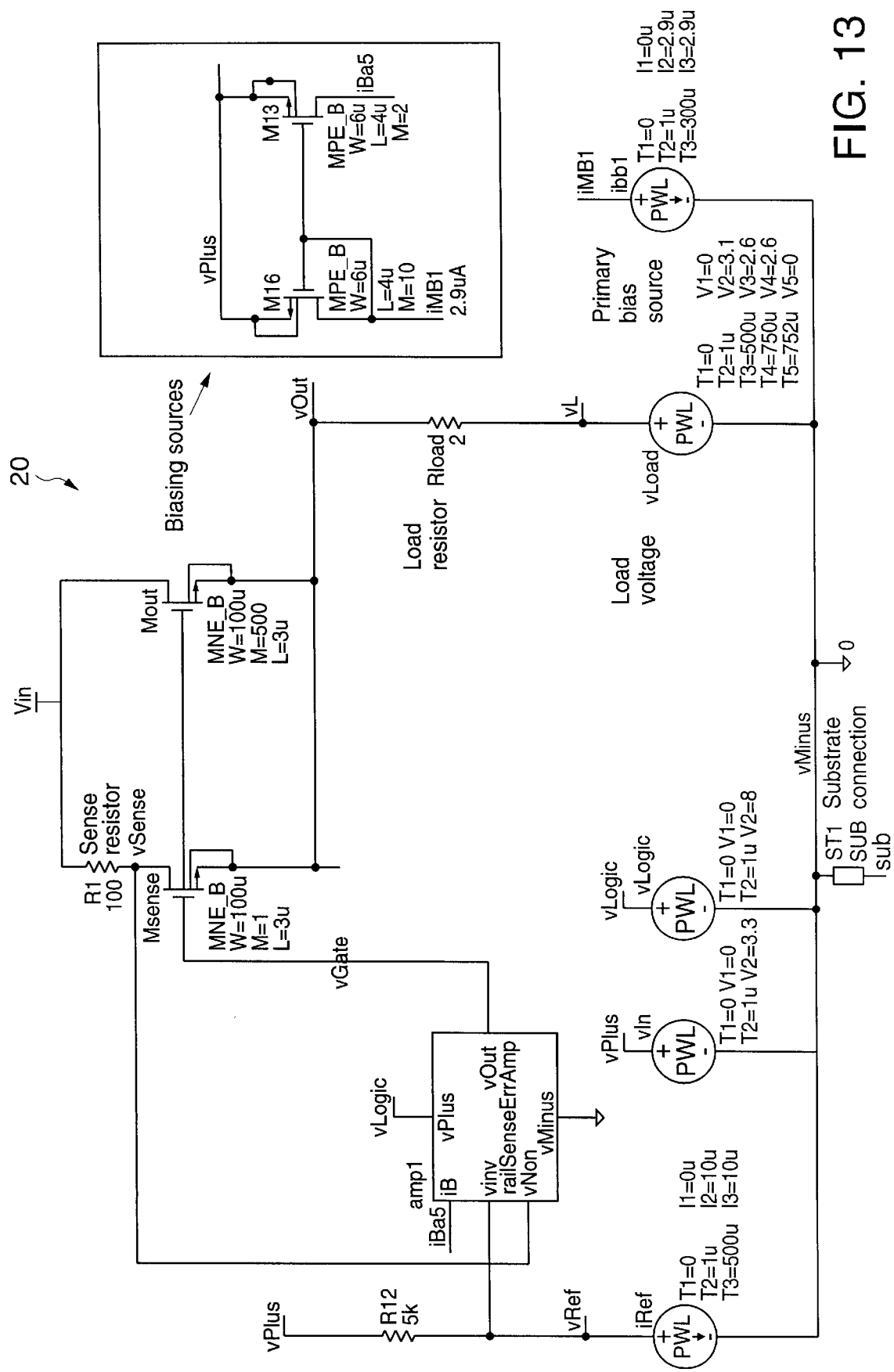
FIG. 13 illustrates a detailed implementation of a conventional current sensing circuit.

Current sensing circuit 200 of FIG. 14 provides accurate current sensing for a power device $M_{out}$ under all load conditions. FIGS. 11a–c are graphs of the current and voltage characteristics of current sensing circuit 200 in response to a linearly ramped load current and to a short-circuit condition at the load. In FIGS. 11a–c, current sense circuit 200 is operated at an input voltage $V_{in}$ of 3.3 volts and the current limit is set to 250 mA.

Figure 10A:
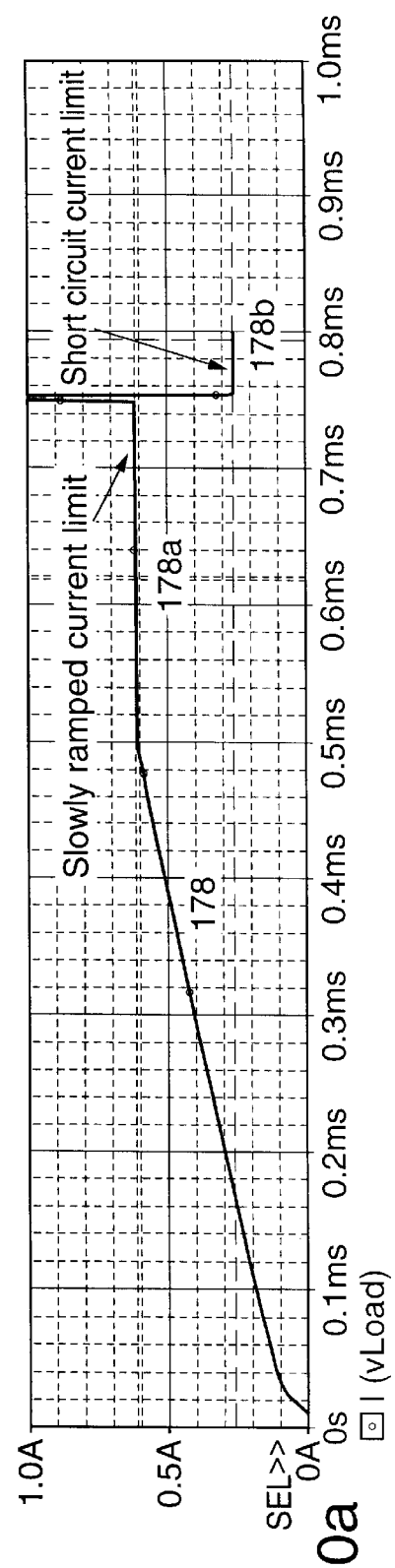
FIGS. 10a–c illustrate the current and voltage characteristics of the conventional current sensing circuit of FIG. 13 in response to a linearly ramped load current and to a short-circuit load.
Figure 10B:
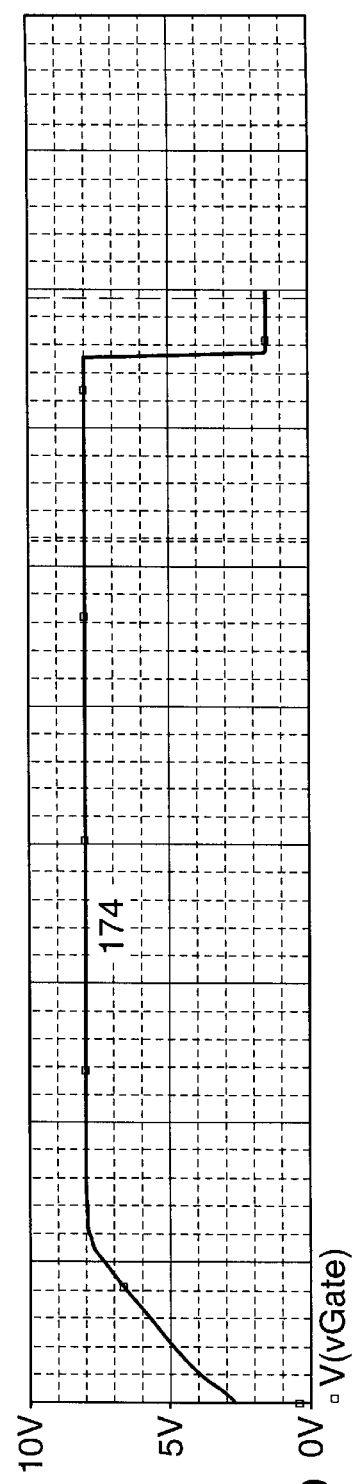
Figure 10C:
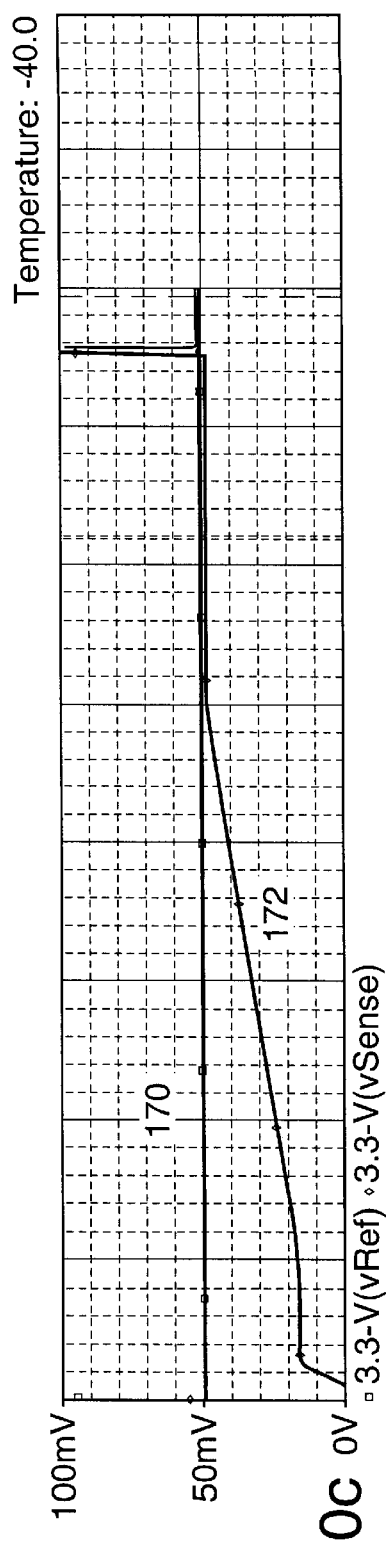

Curve 188 of FIG. 11a illustrates the behavior of the load current of current sensing circuit 200. Curve 184 of FIG. 11b illustrates the gate voltage as applied to both the sense device and the power device. Curve 186 illustrates the output voltage (vOut in FIG. 14) at the load of current sensing circuit 200. Curves 180 and 182 of FIG. 11c illustrate the voltage at reference resistor $R_{Ref}$ and the voltage at sense resistor $R_{Sense}$, respectively, with reference to the input voltage $V_{in}$. For current sensing circuit 200, the current limit for a ramped load is about 267 mA (curve portion 188a) while the current limit for a short-circuited load is 239 mA (curve portion 188b). The discrepancy of the two current limits is only 11% which is a significant improvement over the conventional current sensing circuit (which has a discrepancy of 135%). The reference voltage curve 180 of FIG. 11c demonstrates the effect of the varying reference current according to the present invention. Instead of being a fixed reference voltage as in the conventional sensing circuit (curve 170 of FIG. 10c), the reference voltage of current sensing circuit 200 (curve 180) varies throughout the operation of the sensing circuit. From a time zero to about 0.5 ms, the load current is linearly ramped up and the power device $M_{out}$ is biased in the linear region. To compensate for the error caused by the voltage drop across the sense resistor, the reference current, and correspondingly the reference voltage, are diminished from time zero to 0.5 ms to effectuate sensing correction. In the present embodiment, reference voltage is decreased to 23 mV, about 46% of the full-scale reference voltage of 50 mV. Then, as the load current increases towards the current limit value, the voltage drop across the power device increases, less correction of the reference current is necessary and the reference voltage is increased to 41 mV. At about 0.50 ms, current sensing circuit 200 detects a current limit condition and limits the load current to 267 mA (curve portion 188a). Current sensing circuit regulates the gate voltage (curve 184) to limit the load current. At time 0.5 ms, the gate voltage is regulated from its maximum value of 8 volts down to the value of about 4.2 volts in order to reduce the load current. This characteristic of current sensing circuit 200 is not observed in the conventional current sensing circuit as shown by curve 174 of FIG. 10b. When a short circuit load is applied to current sensing circuit 200, the reference voltage increase to the full scale of 50 mV because under this condition, no correction is necessary. The current is limited to 239 mA which is close to the intended 250 mA current limit. By varying the reference current and, in turns, the reference voltage, current sensing circuit 200 is able to detect the current limit condition accurately and obtain sensing accuracy not achievable by the conventional circuits.

Figure 15A:
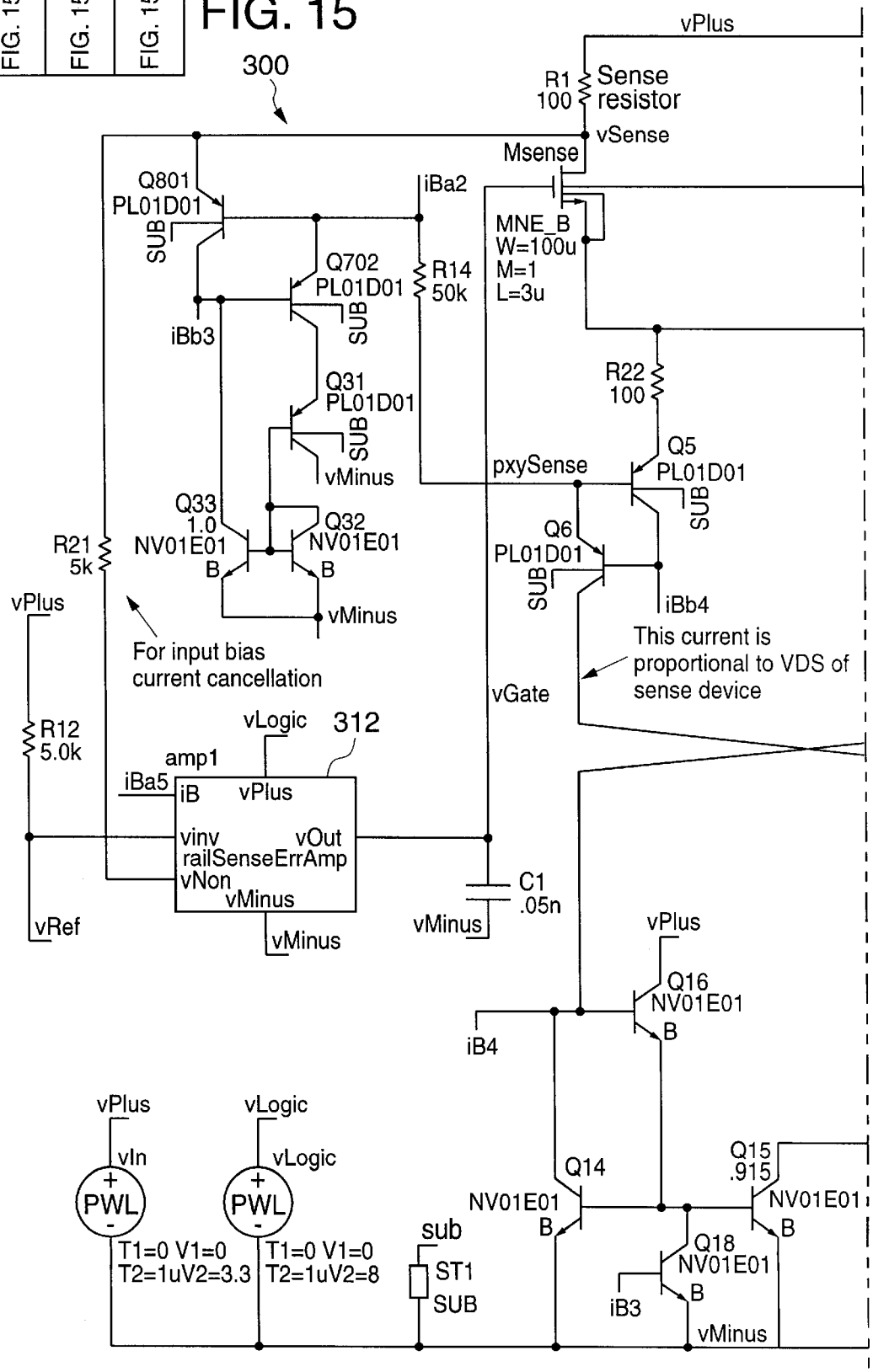
FIG. 15, consisting of FIGS. 15a, 15b and 15c, illustrates a detailed implementation of an enhanced current sensing circuit according to one embodiment of the present invention.
Figure 15B:
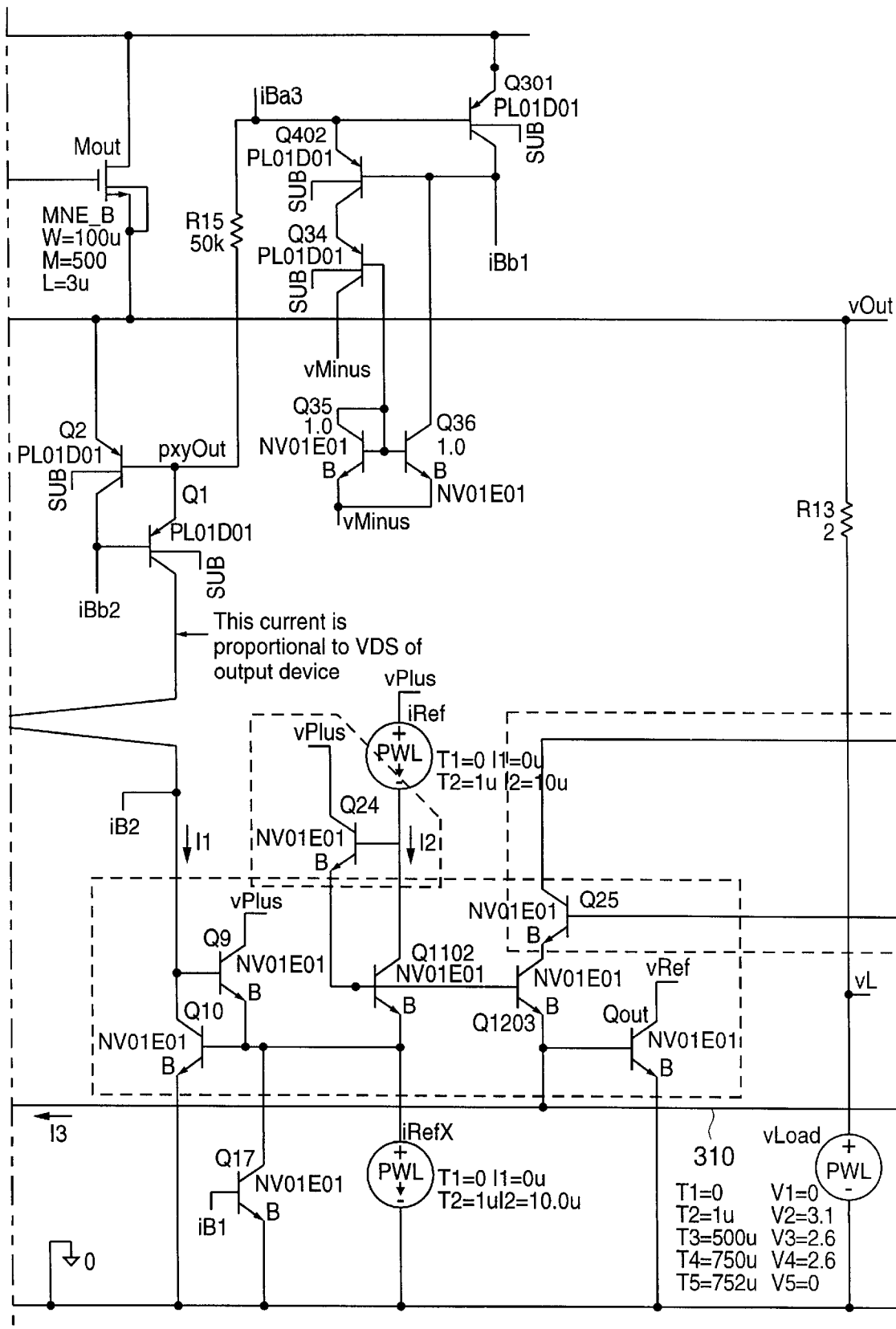
Figure 15C:
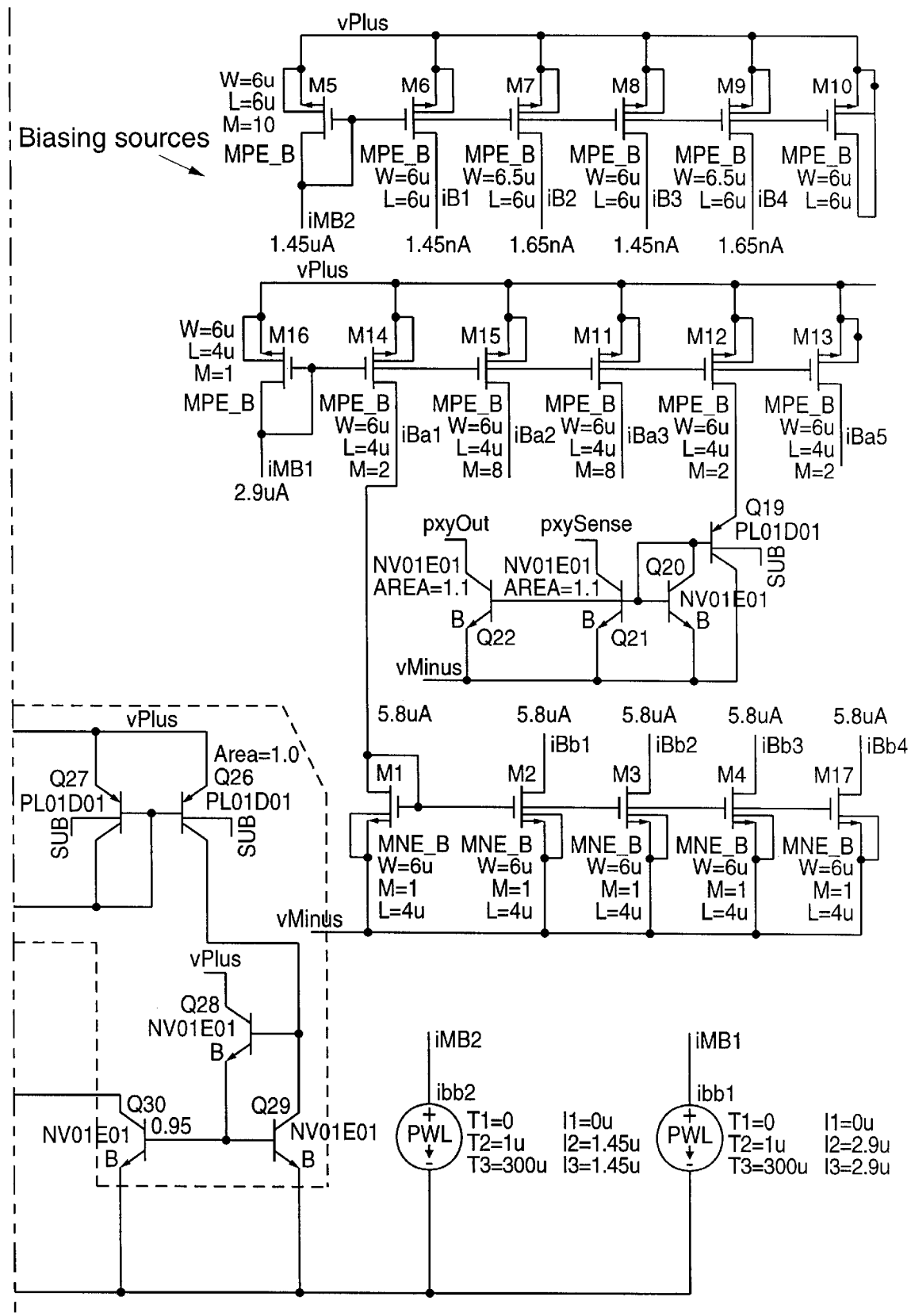

In accordance to the present invention, enhancements to the current sensing circuits of the present invention described above are possible to further improve the accuracy of the current sensing performance. The enhancements are provided to correct for the fact that base currents are not zero, for the voltage drop across the sense resistor due to the bias current of the transconductance amplifier, and for the voltage error due to the input currents associated with the error amplifier. FIG. 15 illustrates a current sensing circuit according to the present invention incorporating enhancements for cancellation of base currents. Although several enhancements for base current cancellation are included in current sensing circuit 300 of FIG. 15, one of ordinary skill in the art would appreciate that not all of the enhancements are needed at the same time and that the enhancements can be applied appropriately to achieve the desired performance level.

First, base current cancellation can be applied to the transconductance amplifiers of the current sensing circuit. Referring to FIG. 8, for optimal performance of transconductance amplifiers 83 and 84, all of current $I_{Bias2}$ should pass through transistor Q1 of the transconductance amplifier. However, in operation, a part of current $I_{Bias2}$ is injected into the base terminal (node 119) of transistor Q2. Therefore, it is desirable to provide base current cancellation to the base terminal of transistor Q2 so that all of current $I_{Bias2}$ will flow through transistor Q1. Such a base current cancellation circuit is illustrated in FIG. 15. In FIG. 15, transistors Q702 and Q402 are the equivalent of transistor Q2 in transconductance amplifiers 83 and 84 of FIG. 8 and transistors Q301 and Q801 are the equivalent of transistor Q1 in transconductance amplifiers 83 and 84. With reference to transistor Q402, a transistor Q34 is added in series with transistor Q402. The base current of transistor Q34 is the collector current $I_{C4}$ of transistor Q402 divided by the gain $\beta$ of transistor Q34. The base current of transistor Q34 is mirrored by a current mirror made up of transistors Q35 and Q36. The output of the current mirror ($I_{C4}/\beta$) is coupled back to the base terminal of transistor Q402. In this manner, the base current of transistor Q402 is satisfied solely by the current from the current mirror (transistors Q35 and Q36) and all of current $I_{Bias2}$ flow through transistor Q301. In the embodiment shown in FIG. 15, the same base current correction circuit (transistors Q31, Q32 and Q33) is applied to transistor Q702 of the transconductance amplifier for the sense device.

The second enhancement involves correcting the base current error of transistor Q3 in the translinear circuit (FIG. 9). As mentioned above, in translinear circuit 137, current $I_P$ is pulled from the emitter terminal of transistor Q3. However, the collector current $I_{C3}$ of transistor Q3 is less than current $I_P$ since the collector current $I_{C3}$ is given by $I_{C3}=I_{E3}-I_{B3}$, where $I_{E3}$ and $I_{B3}$ are the emitter current and the base current, respectively, of transistor Q3. In order to establish a $V_{BE}$ voltage at transistor Q3 which corresponds to the approximator current $I_P$, the collector current of transistor Q3 needs to be as close to approximator current $I_P$ as possible. Thus, correction to cancel out the base current $I_{B3}$ Of transistor Q3 is needed. Such a correction is provided in FIG. 15 by transistors Q25 to Q30.

Referring to FIG. 15, transistor Q1203 is the equivalent of transistor Q3 in FIG. 9 and approximator current $I_P$ (denoted I3 in FIG. 15) is coupled to the emitter current of transistor Q1203. Transistor Q25 is coupled in series with transistor Q1203 to pass a current equaling the collector current $I_{C3}$ of transistor Q1203. The base current $I_{C25}$ of transistor Q25 is thus $I_{C3}/\beta$. The base current $I_{C25}$ is mirrored by a first current mirror comprising transistors Q26 and Q27 and then mirrored again by a second current mirror comprising transistors Q28, Q29 and Q30. The output current $I_{C3}/\beta$ of the second current mirror on lead 310 is added to approximator current $I_P$ coupled to the emitter terminal of transistor Q1203. Thus, a current I3 equaling to the sum of approximator current $I_P$ and the correction current $I_{C3}/\beta$ is pulled from the emitter terminal of transistor Q1203. By adding the base current $I_{C3}/\beta$ of transistor Q1203 to the emitter current of the transistor, the collector current of transistor Q1203 is made equal to the approximator current $I_P$ and the translinear circuit is operated with greater accuracy.

The third enhancement involves correcting the base current error of transistor Q2 in translinear circuit 137 (FIG. 9). In translinear circuit 137, fixed reference current $I_{Ref0}$ is coupled to the collector and base terminals (node 150) of transistor Q2. To establish the proper $V_{BE}$ voltage at transistor Q2, it is desired that all of fixed reference $I_{Ref0}$ is passed through the collector terminal of the transistor. However, a portion of fixed reference $I_{Ref0}$ is passed to the base terminal of transistor Q2 instead. In FIG. 15, a transistor Q24 is added to the base terminal of transistor Q1102 (which is the equivalent of transistor Q2 translinear circuit 137 of FIG. 9). The base terminal of transistor Q24 is coupled to fixed reference current $I_{Ref0}$ (denoted iRef in FIG. 15). By using transistor Q24 to bias the base terminal of transistor Q1102 as opposed to a simple short-circuit, the base current drawn by transistor Q1102 is reduced by $1/\beta$. Thus, transistor Q24 corrects for base current error at transistor Q1102 such that substantially all of fixed reference current $I_{Ref0}$ goes through transistor Q1102.

A fourth enhancement to the current sensing circuit of the present invention is made to correct for the error caused by the error amplifier of the control circuitry. Referring to FIG. 6, voltage $V_{Sense}$ at node 76 and voltage $V_{Ref}$ at node 78 are coupled to error amplifier 80. Because error amplifier 80 draws currents at its input terminals, the voltage $V_{Sense}$ and $V_{Ref}$ can be altered due to the current at the error amplifier. Referring to FIG. 15, because reference resistor $R_{Ref}$ is 5 k$\Omega$ while sense resistor $R_{Sense}$ is only 100 $\Omega$, the current drawn by error amplifier 312 (denoted SenseErrAmp) causes voltage $V_{Ref}$ to be reduced, in excess of the reduction at sense device $M_{Sense}$. To compensate for the voltage error at voltage $V_{Ref}$, a resistor R21 is added between voltage $V_{Sense}$ and the input terminal to error amplifier 312. Resistor R21 has the same resistance as reference resistor $R_{Ref}$. Thus, the same voltage drop caused by the current at the input terminals of error amplifier 312 appears at the reference voltage $V_{Ref}$ node and the sensed voltage $V_{Sense}$ node.

As mentioned above, the correction used by the current sensing circuit of the present invention assumes that the drain current vs. drain-to-source voltage characteristics in the linear region of a MOS transistor can be closely approximated as a linear I-V relationship. However, as is well known in the art, the current-voltage (I-V) characteristics in the linear region is not strictly linear and in fact, the slope of the curve decreases and the current values flatten out as the drain-to-source voltages approach saturation. Current sensing circuit 300 of FIG. 15 includes an enhancement to account for the non-linearity in the I-V characteristics. The discrepancy due to the curvature in the drain current vs. drain-to-source voltage characteristics in the linear region is approximately given by the ratio of the average $V_{DS}$ between the power and sense MOS transistors divided by the saturation voltage $V_{DSat}$, which is equal to $V_{GS}-V_{Threshold}$. In the present embodiment, the correction value is about 90 percent. In FIG. 15, the correction is applied to transistor Q15 which, together with transistor Q14, functions as a current mirror and acts to sink approximator current $I_P$ (denoted as $I_3$ in FIG. 15) from transistor Q1203 of the translinear circuit. The area ratio of transistor Q15 to transistor Q14 is adjusted to be 0.915 to 1. By making the area of transistor Q15 smaller, the current mirror ratio is accordingly decreased to 0.915. Thus, in the computation of equation (3) by the translinear circuit, the varying reference current $I_{Ref}$ is divided by $0.915*I_P$ as opposed to $I_P$ in equation (3). In the manner, the varying reference current $I_{Ref}$ is corrected for the non-linearity of the drain current vs. drain-to-source voltage characteristics.

Current sensing circuit 300 of FIG. 15 achieves enhanced performance as compared to current sensing circuit 200 of FIG. 14. FIGS. 12a–c are graphs of the current and voltage characteristics of current sensing circuit 300 in response to a linearly ramped load current and to a short-circuited load. In FIGS. 12a–c, current sense circuit 300 is operated under the same conditions as current sensing circuit 200 of FIGS. 11a–c. Referring to FIG. 12a, the load current of current sensing circuit 300 is increased linearly until the current reaches the current limit at about 460 us. The current limit under the ramped current condition is 243 mA (curve portion 198a). At time 750 us when the load is short circuited, the current limit is 234 mA (curve portion 198b). Thus, the discrepancy between the two current limits is only 3.8%, representing a marked improvement over current sensing circuit 200. Curves 194 and 196 of FIG. 12b illustrate the gate voltage and the output voltage of current sensing circuit 300. When current limit condition is detected, the gate voltage (curve 194) decreases to regulate the current through the power device. Curves 190 and 192 of FIG. 12c illustrate the reference voltage and the sensed voltage of sensing circuit 300. In this case, the absolute voltage at the reference voltage node and the sensed voltage node is plotted, rather than the voltage across the reference resistor and the sense resistor as in FIG. 11c. In FIG. 12c, the reference voltage is diminished to about 30 mV (3.3V minus 3.27 V) while the load current is being ramped up and the reference voltage increases to 40 mV when the current limit condition is reached. As shown in FIGS. 12a–c, current sensing circuit 300, with the enhancements described above, is able to achieve even better performance in current sensing accuracy than current sensing circuit 200.

The above detailed descriptions are provided to illustrate specific embodiments of the present invention and are not intended to be limiting. Numerous modifications and variations within the scope of the present invention are possible. For example, one of ordinary skill in the art would appreciate that the power device and the sense device can be implemented as p-channel transistors and such a person of ordinary skill would know how to modify the terminal conditions when p-channel transistors are used. Furthermore, the sense resistor and the reference resistor can be fabricated in numerous ways as long as matching resistors are produced. The present invention is defined by the appended claims.

I claim:

1. A circuit for sensing a first current flowing through a load and a power-controlling pass device, connected in series between a first supply voltage and a second supply voltage, comprising:

a sense device coupled between a first node and said second supply voltage and having a smaller dimension than said pass device;

a sense resistor coupled between said first node and a second node between said load and said pass device, said sense resistor and said sense device carrying a second current proportional to said first current and generating a sensed potential across said sense resistor; and a variable reference current source for providing a varying reference current to generate a reference potential to compare with said sensed potential;

wherein said varying reference current is varied according to a ratio of the voltage across said sense device to the voltage across said pass device.

2. The circuit of claim 1, wherein said variable reference current source comprises:

a first current source for providing a fixed reference current; and a computation block for generating said varying reference current as a function of said fixed reference current scaled by said ratio of the voltage across said sense device to the voltage across said pass device.

3. A circuit for sensing a first current flowing through a power-controlling pass device and a load, connected in series between a first supply voltage and a second supply voltage, comprising:

a sense device coupled between a first node and a second node between said pass device and said load and having a smaller dimension than said pass device;

a sense resistor coupled between said first node and said first supply voltage, said sense resistor and said sense device carrying a second current proportional to said first current and generating a sensed potential across said sense resistor; and a variable reference current source for providing a varying reference current to generate a reference potential to compare with said sensed potential;

wherein said varying reference current is varied according to a ratio of the voltage across said sense device to the voltage across said pass device.

4. The circuit of claim 3, wherein said variable reference current source comprises:

a first current source for providing a fixed reference current; and a computation block for generating said varying reference current as a function of said fixed reference current scaled by said ratio of the voltage across said sense device to the voltage across said pass device.

5. A current sensing circuit, comprising:

a load electrically coupled between a first supply voltage and a first node;

a power-controlling pass device coupled between said first node and a second supply voltage, said pass device controlling a first current flowing through said load and said pass device;

a sense device coupled between a second node and said second supply voltage and having a smaller dimension than said pass device;

a sense resistor coupled between said first node and said second node, said sense resistor and said sense device carrying a second current proportional to said first current and generating a sensed potential across said sense resistor; and a variable reference current source for providing a varying reference current to generate a reference potential to compare with said sensed potential;

wherein said varying reference current is varied according to a ratio of the voltage across said sense device to the voltage across said pass device.

6. The circuit of claim 5, further comprising:

a reference resistor coupled between said first node and said variable reference current source, said varying reference current generating said reference potential across said reference resistor; and an error amplifier for comparing said sensed potential and said reference potential and generating a control signal for controlling said pass device and said sense device.

7. The circuit of claim 5, wherein said variable reference current source comprises:

a first current source for providing a fixed reference current; and a computation block for generating said varying reference current as a function of said fixed reference current scaled by said ratio of the voltage across said sense device to the voltage across said pass device.

8. The circuit of claim 5, wherein said pass device and said sense device are MOS transistors and said varying reference current is varied according to a ratio of the drain-to-source voltage of said sense device to the drain-to-source voltage of said pass device.

9. The circuit of claim 5, wherein said variable reference current source comprises:

a first transconductance amplifier having a first input terminal and a second input terminal coupled across said sense device, and providing a first output current indicative of the voltage across said sense device; and a second transconductance amplifier having a first input terminal and a second input terminal coupled across said pass device, and providing a second output current indicative of the voltage across said pass device.

10. The circuit of claim 9, wherein said variable reference current source further comprises:

a translinear circuit having a first input terminal coupled to receive said first output current of said first transconductance amplifier, a second input terminal coupled to receive said second output current of said second transconductance amplifier, a third input terminal for receiving a fixed reference current, and an output terminal providing said varying reference current;

wherein said varying reference current equals to said fixed reference current scaled by a ratio of said first output current to said second output current.

11. A current sensing circuit, comprising:

a power-controlling pass device coupled between a first supply voltage and a first node;

a load electrically coupled between said first node and a second supply voltage, said pass device controlling a first current flowing through said load and said pass device;

a sense device coupled between a second node and said first node and having a smaller dimension than said pass device;

a sense resistor coupled between said first supply voltage and said second node, said sense resistor and said sense device carrying a second current proportional to said first current and generating a sensed potential across said sense resistor; and a variable reference current source for providing a varying reference current to generate a reference potential to compare with said sensed potential;

wherein said varying reference current is varied according to a ratio of the voltage across said sense device to the voltage across said pass device.

12. The circuit of claim 11, further comprising:

a reference resistor coupled between said first supply voltage and said variable reference current source, said varying reference current generating said reference potential across said reference resistor; and an error amplifier for comparing said sensed potential and said reference potential and generating a control signal for controlling said pass device and said sense device.

13. The circuit of claim 11, wherein said variable reference current source comprises:

a first current source for providing a fixed reference current; and a computation block for generating said varying reference current as a function of said fixed reference current scaled by said ratio of the voltage across said sense device to the voltage across said pass device.

14. The circuit of claim 11, wherein said pass device and said sense device are MOS transistors and said varying reference current is varied according to a ratio of the drain-to-source voltage of said sense device to the drain-to-source voltage of said pass device.

15. The circuit of claim 11, wherein said variable reference current source comprises:

a first transconductance amplifier having a first input terminal and a second input terminal coupled across said sense device, and providing a first output current indicative of the voltage across said sense device; and a second transconductance amplifier having a first input terminal and a second input terminal coupled across said pass device, and providing a second output current indicative of the voltage across said pass device.

16. The circuit of claim 15, wherein said pass device and said sense device are MOS transistors and said first output current is indicative of a drain-to-source voltage of said sense device and said second output current is indicative of a drain-to-source voltage of said pass device; and wherein said varying reference current is varied according to a ratio of said first output current to said second output current.

17. The circuit of claim 15, wherein each of said first and second transconductance amplifiers comprises:

a first transistor having a first current handling terminal coupled to a first bias current terminal, a second current handling terminal coupled to said first input terminal, and a control terminal coupled to a second bias current terminal;

a second transistor having a first current handling terminal coupled to said second supply voltage, a second current handling terminal coupled to said second bias current terminal, and a control terminal coupled to said first bias current terminal;

a third transistor having first current handling terminal coupled to said first bias current terminal, a second current handling terminal coupled to said second input terminal, and a control terminal;

a fourth transistor having a first current handling terminal coupled to a bias voltage terminal, a second current handling terminal coupled to said control terminal of said third transistor, and a control terminal coupled to said first bias current terminal; and a resistor coupled between said control terminal of said first transistor and said control terminal of said third transistor.

18. The circuit of claim 17, wherein a voltage across said resistor is indicative of said voltage between said first input terminal and said second input terminal.

19. The circuit of claim 17, wherein said first, second, third, and fourth transistors are PNP bipolar transistors.

20. The circuit of claim 19, wherein a collector current at said first current handling terminal of said fourth transistor has a value indicative of said voltage between said first input terminal and said second input terminal.

21. The circuit of claim 19, wherein each of said first and second transconductance amplifiers further comprises:

a fifth transistor having a first current handling terminal coupled to said first current handling terminal of said second transistor, a second current handling terminal coupled to said second supply voltage, and a control terminal; and a current mirror coupled to said control terminal of said fifth transistor, said current mirror having an output terminal coupled to said control terminal of said second transistor.

22. The circuit of claim 17, wherein each of said first and second transconductance amplifiers further comprises:

a second resistor coupled between said first input terminal and said second current handling terminal of said first transistor, said second resistor having the same resistance value as said sense resistor.

23. The circuit of claim 15, wherein said variable reference current source further comprises:

a translinear circuit having a first input terminal coupled to receive said first output current of said first transconductance amplifier, a second input terminal coupled to receive said second output current of said second transconductance amplifier, a third input terminal for receiving a fixed reference current, and an output terminal providing said varying reference current;

wherein said varying reference current equals to said fixed reference current scaled by a ratio of said first output current to said second output current.

24. The circuit of claim 23, wherein said translinear circuit comprises:

a first npn bipolar transistor having a collector terminal coupled to said first input terminal, an emitter terminal coupled to said second supply voltage, and a base terminal coupled to said third input terminal for receiving said fixed reference current;

a second npn bipolar transistor having a collector terminal and a base terminal coupled together to said third input terminal for receiving said fixed reference current, and an emitter terminal coupled to said base terminal of said first npn bipolar transistor;

a third npn bipolar transistor having a collector terminal coupled to said first supply voltage, an emitter terminal coupled to a current mirror, said current mirror coupled to said second input terminal for drawing a current from said emitter terminal of said third npn bipolar transistor equaling to said second output current of said second transconductance amplifier, and a base terminal coupled to said collector terminal of said second npn bipolar transistor;

a fourth npn bipolar transistor having a collector terminal coupled to said output terminal for providing said varying reference current, an emitter terminal coupled to said second supply voltage, and a base terminal coupled said emitter terminal of said third npn bipolar transistor;

a fifth npn bipolar transistor having a collector terminal coupled to said first supply voltage, an emitter terminal coupled to said base terminal of said first npn bipolar transistor, and a base terminal coupled to said collector terminal of said first npn bipolar transistor and to a first bias current terminal; and a sixth npn bipolar transistor having a collector terminal coupled to said base terminal of said first npn bipolar transistor, an emitter terminal coupled to said second supply voltage, and a base terminal coupled to a second bias current terminal.

25. The circuit of claim 24, wherein said current mirror of said translinear circuit comprises:

a first npn bipolar transistor having a collector terminal coupled to said first supply voltage, an emitter terminal, and a base terminal coupled to said second input terminal of said translinear circuit;

a second npn bipolar transistor having a collector terminal coupled to said base terminal of said first npn bipolar transistor, an emitter terminal coupled to said second supply voltage, and a base terminal coupled to said emitter terminal of said first npn bipolar transistor;

a third npn bipolar transistor having a collector terminal providing an output current to said translinear circuit, an emitter terminal coupled to said second supply voltage, and a base terminal coupled to said base terminal of said second npn bipolar transistor; and a fourth npn bipolar transistor having a collector terminal coupled to said base terminal of said second npn bipolar transistor, an emitter terminal coupled to said second supply voltage, and a base terminal coupled to a third bias current terminal.

26. The circuit of claim 25, wherein an emitter area of said third npn bipolar transistor is about 0.9 times an emitter area of said second npn bipolar transistor.

27. The circuit of claim 24, wherein said translinear circuit further comprises:

a seventh npn bipolar transistor having a collector terminal coupled to said first supply voltage, an emitter terminal coupled to said base terminal of said second npn bipolar transistor, and a base terminal coupled to said collector terminal of said second npn bipolar transistor.

28. The circuit of claim 24, wherein said translinear circuit further comprises:

a seventh npn bipolar transistor having a collector terminal coupled to said first supply voltage, an emitter terminal coupled to said collector terminal of said third npn bipolar transistor, and a base terminal;

a second current mirror coupled to said base terminal of said seventh transistor and having a first output terminal;

a third current mirror coupled to said first output terminal of said second current mirror and having a second output terminal coupled to said emitter terminal of said third transistor.

29. The circuit of claim 12, further comprises:

a second resistor coupled between said second node and an input terminal of said error amplifier, said second resistor having the same resistance value as said reference resistor.

30. A current sensing circuit comprising:

a power-controlling pass device coupled between a first supply voltage and a first node, and having a control terminal;

a load electrically coupled between said first node and a second supply voltage, said pass device controlling a first current flowing through said load and said pass device;

a sense device coupled between a second node and said first node and having a control terminal, said sense device having a smaller dimension than said pass device;

a sense resistor coupled between said first supply voltage and said second node, said sense resistor and said sense device carrying a second current proportional to said first current and generating a sensed potential across said sense resistor;

a first transconductance amplifier having a first input terminal and a second input terminal coupled across said sense device, and providing a first output current indicative of the voltage across said sense device;

a second transconductance amplifier having a first input terminal and a second input terminal coupled across said pass device, and providing a second output current indicative of the voltage across said pass device;

a translinear circuit having a first input terminal coupled to receive said first output current of said first transconductance amplifier, a second input terminal coupled to receive said second output current of said second transconductance amplifier, a third input terminal for receiving a fixed reference current, and an output terminal providing a varying reference current;

a reference resistor coupled between said first supply voltage and said output terminal of said translinear circuit, said reference resistor generating a reference potential proportional to said varying reference current; and an error amplifier for comparing said sense potential and said reference potential and providing an output signal coupled to said control terminals of said pass device and said sense device;

wherein said varying reference current is varied according to a ratio of the voltage across said sense device to the voltage across said pass device.

31. A method for sensing a first current through a power-controlling pass device, comprising:

coupling a sense device and a sense resistor across said pass device;

generating a sensed potential across said sense resistor indicative of a sense current flowing through said sense resistor and said sense device, said sense current being proportional to said first current;

generating a varying reference current;

generating a reference potential indicative of said varying reference current;

comparing said sensed potential and said reference potential; and adjusting said varying reference current according to a ratio of the voltage across said sense device to the voltage across said pass device.

32. The method of claim 31, wherein said adjusting said varying reference current comprises:

measuring a first voltage across said sense device;

measuring a second voltage across said pass device;

providing a fixed reference current; and scaling said fixed reference current by a ratio of said first voltage to said second voltage.

33. The method of claim 31, wherein said adjusting said varying reference current comprises:

measuring a first voltage across said sense device;

generating a first current indicative of said first voltage;

measuring a second voltage across said pass device;

generating a second current indicative of said second voltage;

providing a fixed reference current; and scaling said fixed reference current by a ratio of said first current to said second current.

34. The method of claim 31, further comprising:

generating a control signal indicative of a difference between said sensed potential and said reference potential; and limiting said first current through said pass device using said control signal.

* * * * *